United States Patent
Chun

(10) Patent No.: US 7,139,539 B2
(45) Date of Patent: Nov. 21, 2006

(54) ADAPTIVE POWER POOLING APPARATUS AND METHOD IN A MOBILE COMMUNICATION SYSTEM

(75) Inventor: Byung-Jin Chun, Suwon-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 503 days.

(21) Appl. No.: 10/616,964

(22) Filed: Jul. 11, 2003

(65) Prior Publication Data

US 2004/0014500 A1 Jan. 22, 2004

(30) Foreign Application Priority Data

Jul. 13, 2002 (KR) .................... 10-2002-0041023

(51) Int. Cl.
*H04B 1/04* (2006.01)

(52) U.S. Cl. ................ 455/127.1; 455/453; 455/127.3; 330/124 R; 330/126

(58) Field of Classification Search ............ 455/127.1, 455/561, 562.1, 95, 99, 102, 107, 111, 114.3, 455/115.2, 115.1, 127.3, 424, 425, 456.5, 455/456.6, 550.1, 575.1, 453, 69, 553.1, 455/114.2, 121, 126, 127.2, 101, 17, 63.1, 455/67.11, 123; 342/373, 374; 330/124 R, 330/286, 295, 147, 148, 297, 136, 151, 149, 330/150, 126; 343/853, 865, 814; 333/109, 333/116, 117, 5, 2, 1, 120, 4

See application file for complete search history.

(56) References Cited

U.S. PATENT DOCUMENTS

| | | | | |
|---|---|---|---|---|
| 5,574,967 A | * | 11/1996 | Dent et al. | 455/12.1 |
| 5,604,462 A | * | 2/1997 | Gans et al. | 330/124 R |
| 5,646,631 A | * | 7/1997 | Arntz | 342/373 |
| 5,834,972 A | * | 11/1998 | Schiemenz et al. | 330/124 R |
| 5,917,371 A | * | 6/1999 | Chesarek et al. | 330/124 R |
| 5,955,920 A | * | 9/1999 | Reudink et al. | 330/124 R |
| 5,966,048 A | * | 10/1999 | Thompson | 330/124 R |
| 6,006,111 A | * | 12/1999 | Rowland | 455/561 |
| 6,243,038 B1 | * | 6/2001 | Butler et al. | 342/373 |
| 6,342,810 B1 | * | 1/2002 | Wright et al. | 330/51 |
| 6,381,212 B1 | * | 4/2002 | Larkin | 370/210 |
| 6,738,019 B1 | * | 5/2004 | Luz et al. | 342/373 |
| 2003/0214355 A1 | * | 11/2003 | Luz et al. | 330/124 R |

* cited by examiner

*Primary Examiner*—Edward F. Urban
*Assistant Examiner*—Charles Chow
(74) *Attorney, Agent, or Firm*—Roylance, Abrams, Berdo & Goodman, L.L.P.

(57) ABSTRACT

A power pooling apparatus uniformly distributes sector loads in a mobile communication system. The power pooling apparatus comprises a distributor for distributing signals output from a signal generator according to respective sectors; a radio signal processor for performing signal processing to provide an output of the distributor to an antenna; and an adaptive signal processor for determining a characteristic matrix of the distributor by using an output in a predetermined position on a signal processing path of the radio signal processor, and providing the characteristic matrix of the distributor to the distributor.

32 Claims, 15 Drawing Sheets

(a) EXAMPLE OF 3dB COUPLER (b) BLOCK DIAGRAM OF 3dB COUPLER

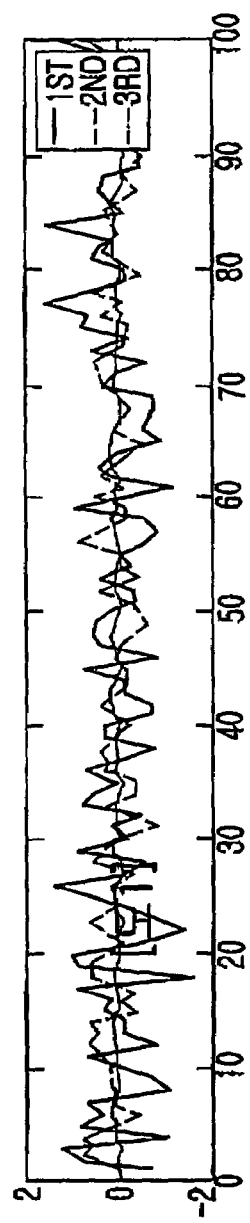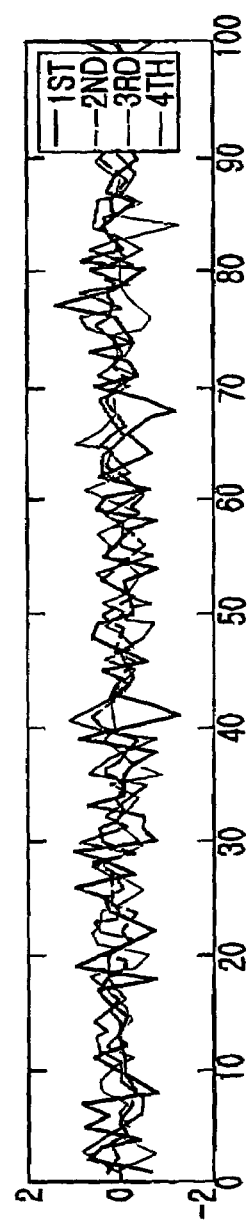

ADAPTIVE POWER POOLING APPARATUS AND METHOD IN A MOBILE COMMUNICATION SYSTEM

PRIORITY

This application claims priority under 35 U.S.C. § 119 to an application entitled "Adaptive Power Pooling Apparatus and Method in a Mobile Communication System" filed in the Korean Intellectual Property Office on Jul. 13, 2002 and assigned Serial No. 2002-41023, the contents of which are incorporated herein by reference.

BACKGROUND OF THE INVENTION

1. Field of the Invention

The present invention relates generally to a power amplification apparatus, and in particular, to a power amplification apparatus in a mobile communication system.

2. Description of the Related Art

In general, a mobile communication system such as a code division multiple access (CDMA) communication system, has a power amplifier (PA) included in its output stage. Power amplifiers power-amplify a radio frequency (RF) signal to provide a signal having an appropriate level for transmission over a radio path via an antenna.

FIG. 1 is a diagram illustrating an example of a prior art power amplification apparatus in a 3-sector antenna system. FIG. 1 is a power amplification apparatus in a 3-sector antenna system having α, β and γ sectors. The power amplification apparatus includes power amplifiers (PAs) 100 which are independently driven in association with corresponding sectors. When many calls are concentrated in a certain sector, the power amplifier for the sector has a heavy load. In order to sufficiently provide services desired by a user to the sector having a heavy load, capacity of the corresponding power amplifier must be increased. Since such a situation may occur for all sectors in the same way, there is a necessity to set capacity of every sector's power amplifier to its maximum possible value.

However, since call distribution per sector is not uniform according to time and sector, a method of setting capacity of every sector's power amplifier to its maximum value may be inefficient in terms of utilization of the power amplifiers. In particular, the life span of a power amplifier having a heavy load is decreased compared with power amplifiers not under a heavy load.

Meanwhile, the conventional power amplification apparatus can include a redundant power amplifier to handle situations in which a service is dropped due to a failure of a certain power amplifier. However, the redundant power amplifier does not operate while the other power amplifiers are being driven, thus increasing inefficiency in terms of the overall utilization of the power amplifiers.

SUMMARY OF THE INVENTION

It is, therefore, an object of the present invention to provide an apparatus and method for efficiently utilizing power amplifiers in a mobile communication system including a plurality of power amplifiers.

It is another object of the present invention to provide a power pooling apparatus and method for uniformly using power amplifiers regardless of non-uniformity of sector loads in a mobile communication system including power amplifiers distinguishable according to sectors.

It is further another object of the present invention to provide a power pooling apparatus and method for making life spans of power amplifiers uniform in a mobile communication system including a plurality of power amplifiers.

It is yet another object of the present invention to provide an apparatus and method for adaptively estimating a distributor's transfer characteristic matrix in order to uniformly drive a power pooling apparatus for every sector.

To achieve the above and other objects, there is provided a power pooling apparatus for uniformly distributing sector loads in a mobile communication system. The power pooling apparatus comprises a distributor for distributing signals output from a signal generator according to respective sectors; a radio signal processor for performing signal processing to provide an output of the distributor to an antenna; and an adaptive signal processor for determining a characteristic matrix of the distributor by using an output in a predetermined position on a signal processing path of the radio signal processor, and providing the characteristic matrix of the distributor to the distributor.

BRIEF DESCRIPTION OF THE DRAWINGS

The above and other objects, features and advantages of the present invention will become more apparent from the following detailed description when taken in conjunction with the accompanying drawings in which:

FIG. 14A is a block diagram illustrating an example of each sector input waveform based on the simulation results of the adaptive power pooling apparatus according to an embodiment of the present invention;

FIG. 14B is a block diagram illustrating an example of an output waveform of a distributor based on the simulation results of the adaptive power pooling apparatus according to an embodiment of the present invention;

DETAILED DESCRIPTION OF THE PREFERRED EMBODIMENT

Several embodiments of the present invention will now be described in detail with reference to the accompanying drawings. In the following description, a detailed description of known functions and configurations have been omitted for conciseness.

The present invention aims at jointly using power amplifiers of respective sectors in a base station in order to overcome inefficient use of the power amplifiers due to non-uniformity of sector loads. Herein, such a principle of the invention will be called "power pooling," and such an apparatus will be called "power pooling apparatus." That is, the power pooling apparatus according to the principle of the present invention refers to a power amplification apparatus having a power distributing and combining function, not a simple power amplification apparatus. Therefore, in the following description, the term "power pooling" will refer to power amplification including power distributing and combining. Herein, the principle of the invention will first be described. Next, embodiments of the invention will be described, and then, the simulation results of the power pooling apparatus according to embodiments of the present invention will be described.

A. Principle of the Invention

Figure 1:
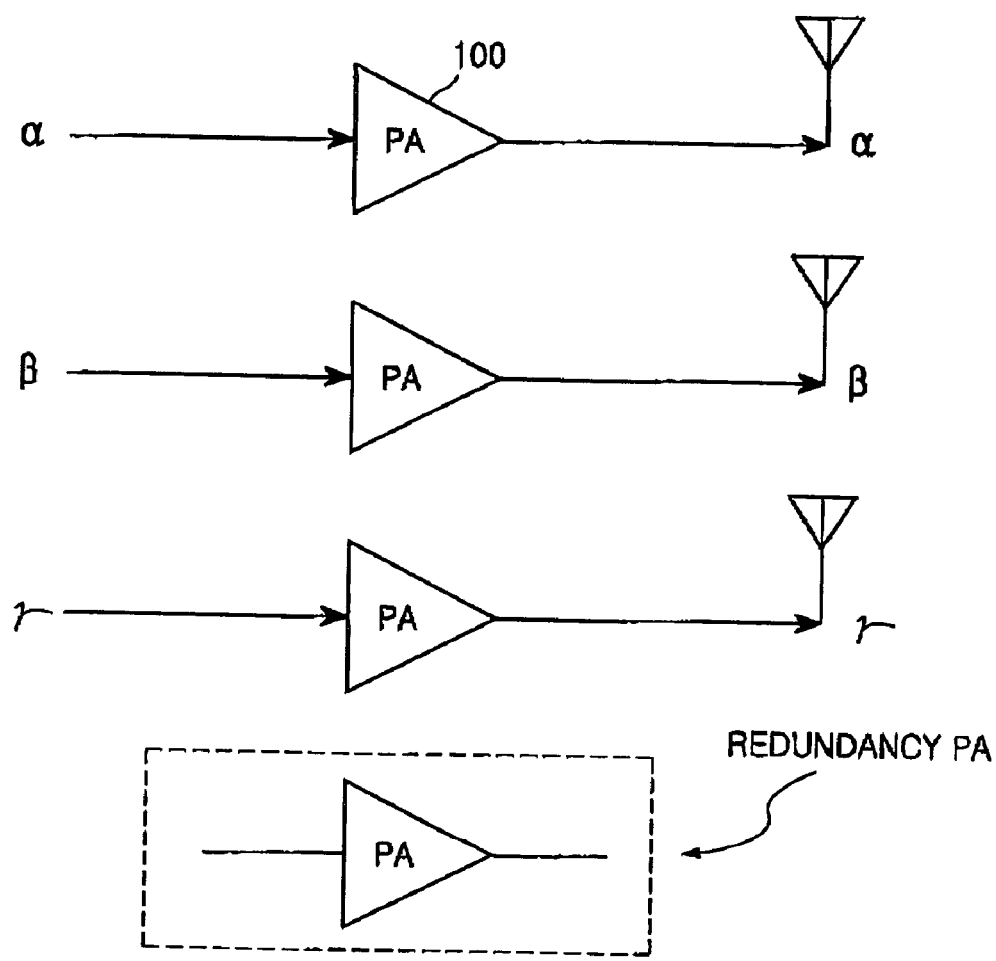
FIG. 1 is a diagram illustrating an example of a prior art 3-sector antenna system.
Figure 2:
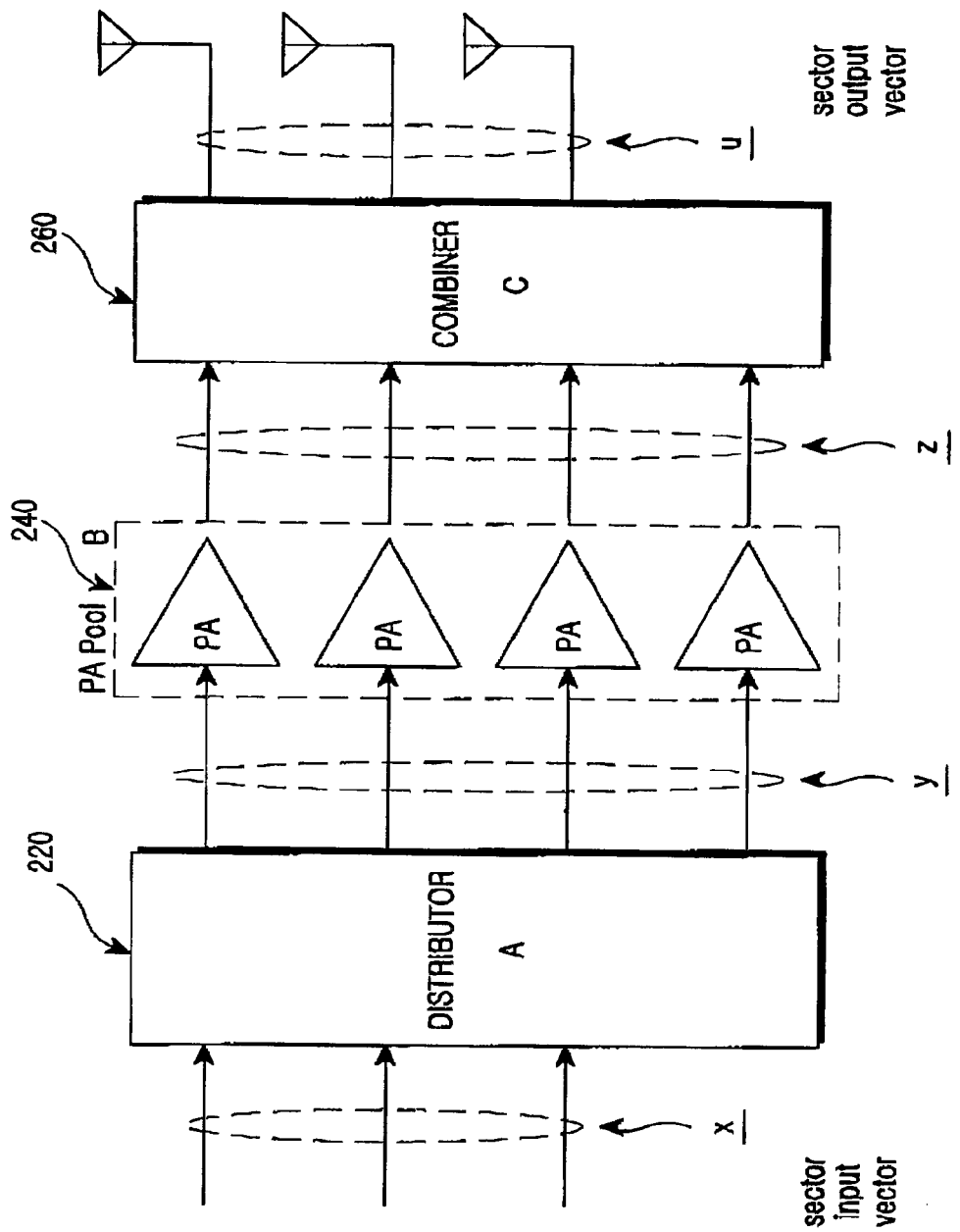
FIG. 2 is a block diagram illustrating an example of an antenna system including a power pooling apparatus according to an embodiment of the present invention.

FIG. 2 is a block diagram illustrating an example of an antenna system including a power pooling apparatus according to an embodiment of the present invention. Referring to FIG. 2, the power pooling apparatus includes a distributor (or distribution device) 220, a power amplification section 240, and a combiner (or combining device) 260. The distributor 220 distributes input signals of respective sectors to power amplifiers of the power amplification section 240. The power amplification section 240 includes a plurality of power amplifiers, and the power amplifiers amplify the signals distributed by the distributor 220. The combiner 260 restores respective sector output signals by combining the signals amplified by the power amplifiers of the power amplification section 240. The restored sector output signals are transmitted via antennas of the respective sectors.

In an embodiment of the present invention, the power amplification apparatus has a cascade structure of the distributor 220—the power amplification section 240—the combiner 260. The power amplification section 240 is comprised of N power amplifiers, and M filtered input signals are applied to the power amplification section 240. A definition of vectors and characteristic matrixes can be given by Table 1 below.

TABLE 1 x: sector input vector (M-by-1)
y: power amplification section (240)'s input vector (N-by-1)
z: power amplification section (240)'s output vector (N-by-1)
u: sector output vector (M-by-1)
v: power amplification section (240)'s noise vector (N-by-1)
A: distributor (220)'s characteristic matrix (N-by-M)
B: power amplification section (240)'s characteristic matrix (N-by-N, Diagonal)
C: combiner (260)'s characteristic matrix (M-by-N)

From Table 1, the following relationship is given.

TABLE 2

$y = Ax$
$z = By + v$
$u = Cz$
$u = CBAx$

Referring to Table 2, an output vector $y$ of the distributor 220 is determined by the product of a sector input vector $x$ and a characteristic matrix A of the distributor 220. An output vector $z$ of the power amplification section 240 is determined by the product of a characteristic matrix B and an input vector $y$ of the power amplification section 240. A sector output vector $u$, an output of the combiner 260, is determined by the product of an output vector $z$ of the power amplification section 240 and a characteristic matrix C of the combiner 260. Therefore, in the power pooling apparatus of FIG. 2, the overall input/output relationship is given by $u=CBAx$.

The power pooling apparatus according to an embodiment of the present invention, having the distributor 220 and the combiner 260 of FIG. 2, preferably satisfies the following conditions.

Condition (1): Requirement of Redundant Power Amplifier

A redundant power amplifier must be included in preparation for unexpected failure of a power amplifier. The redundant power amplifier must be driven together with other power amplifiers rather than remaining in an idle state.

Condition (2): Maintaining of Amplification Characteristics of Sectors

Every sector input signal must be outputted to a corresponding sector output stage while maintaining a designed gain, and must not be leaked out to other sector output stages so as not to interfere with other sector signals.

Condition (3): Uniform Driving of Power Amplifiers

Every power amplifier must be uniformly driven so as to have the same output power regardless of non-uniformity of loads of respective sectors.

Condition (4): No Power Loss of Combiner

Outputs of the power amplifiers must be delivered to antennas without a power loss at the combiner 260.

A principle of the invention for satisfying the above conditions will now be described. In order to satisfy Condition (1), a power pooling apparatus includes the power amplification section 240 in which the number N of power amplifiers is larger than the number M of sectors. On the assumption that the number M of sectors is identical to the number N of power amplifiers, conditions for satisfying the above requirements will be described.

When the number of power amplifiers is larger than the number of sectors, Condition (1) is satisfied by removing as many unnecessary sectors as a difference therebetween from input/output signals. Here, "removing" means grounding input/output signals for the unnecessary sectors as described in FIGS. 6 and 7.

A matrix D for a block connecting a characteristic matrix A of the distributor 220 to a characteristic matrix B of the power amplification section 240 can be defined as $$D=BA \qquad (1)$$

In order to satisfy Condition (2), the overall characteristic of the power amplification apparatus for satisfying Condition (2) must become CBA=αI where α is defined as a desired gain of respective power amplifiers. Therefore, D in Equation (1) becomes $$D=\alpha C^{-1} \qquad (2)$$

In order to satisfy Condition (3), a norm of each element of D must be in a constant on condition to show that there is no correlation between sector input signals. That is, if an $(i,j)^{th}$ element of D is defined as $d_{ij}$, power of a $j^{th}$ element of a sector input vector $\underline{x}$ is defined as $P_{x_j}$, and power of an $i^{th}$ element of an output vector $\underline{z}$ of the power amplification section 240 is defined as $P_{z_i}$, then a relationship of $$P_{z_i} = \sum_{j=1}^{M} |d_{ij}|^2 P_{x_j}$$

is given on condition that there is no correlation between sector input signals. In order that this value should be constant for every i (i=1,2,3, . . . ,N), it is sufficient that a norm of $d_{ij}$ is constant for every i and j. A norm of the $d_{ij}$ is given by $$|d_{ij}|=(\text{const}) \text{ for every } i,j \qquad (3)$$

In order to meet Condition (4), output power of the power amplification section 240 must be identical to output power of the combiner 260. That is, $P_z = P_u$. To this end, a characteristic matrix C of the combiner 260 existing between an output vector $\underline{z}$ of the power amplification section 240 and an output vector $\underline{u}$ of the combiner 260 must maintain its input/output norm. This means that the matrix C is a unitary matrix, which is given by $$CC^H = I \qquad (4)$$

where $(\bullet)^H$ is a Hermitian (conjugate transpose) operator, and I is an identity matrix.

It is noted from Equation (4) that $C^{-1}=C^H$. If this is substituted into Equation (2), $D=\alpha C^H$. Therefore, Condition (3) can be satisfied by allowing a norm of each element value $C_{ij}$ of C to have a constant value for every i and j as shown by Equation (5) below, by using Equation (3) instead of satisfying Condition (3).

$$|c_{ij}|=(\text{const}) \text{ for every } i,j \qquad (5)$$

That is, if the matrix C of the combiner 260 is determined, D can be determined by Equation (2) and A can be determined by Equation (1). If a characteristic of B is constant at $B=\alpha I_{N\times N}$, then A is determined as Equation (6) below by Equation (1) and Equation (2). Here, $I_{N\times N}$ means an N-by-N identity matrix.

$$A=C^{-1} \qquad (6)$$

The determined distributor's matrix A satisfies Condition (2) on condition of the ideal power amplifier.

Meanwhile, the following situations need to be considered in an antenna stage of FIG. 2. Sector outputs from the combiner 260 are fed to antennas via feeding cables. Therefore, even though an output order of the combiner 260 is changed, it is possible to feed a desired sector output to a desired antenna by properly adjusting connection of the feeding cables between the antennas. In addition, since the feeding cables are not uniform in length, a variation in phase due to a length difference between the feeding cables may occur between sector outputs. However, even though a sector output signal form the combiner 260 suffers a phase variation, power pooling performance is not affected.

If such situations are considered, a relationship CBA=αI of the entire power pooling characteristic by Condition (2) is compensated by $$CBA=\alpha QPI \qquad (7)$$

where P is a compensation matrix for the phase variation, and Q is a compensation matrix for a variation in the output order. The matrix P can be represented by Equation (8) below. The matrix Q is a matrix for compensating for a variation in the output order (Q=Permutation of Columns of $I_{M\times M}$). For example, for M=4, the matrix Q can be expressed as Equation (9) below.

$$P = \begin{bmatrix} e^{j\theta_1} & & 0 \\ & \ddots & \\ 0 & & e^{j\theta_M} \end{bmatrix}, (0 \le \theta_1, \ldots, \theta_M < 2\pi) \qquad (8)$$

$$Q = \begin{bmatrix} 0 & 0 & 0 & 1 \\ 0 & 0 & 1 & 0 \\ 0 & 1 & 0 & 0 \\ 1 & 0 & 0 & 0 \end{bmatrix}, Q = \begin{bmatrix} 1 & 0 & 0 & 0 \\ 0 & 0 & 1 & 0 \\ 0 & 1 & 0 & 0 \\ 0 & 0 & 0 & 1 \end{bmatrix} \qquad (9)$$

Summarizing, Equation (4), Equation (5) and Equation (7) show power pooling conditions for the case where the phase variation and the output order variation at the antenna stage are compensated. A matrix A of the distributor 220 and a matrix C of the combiner 260, simultaneously satisfying the power pooling conditions, each have a constant norm, and they constitute a unitary matrix. For example, the matrix A of the distributor 220 and the matrix C of the combiner 260 can be formed with matrixes X and Y given by $$X = \frac{1}{2}\begin{bmatrix} 1 & -j & -j & 1 \\ -j & -1 & 1 & -j \\ -j & 1 & -1 & -j \\ -1 & -j & -j & 1 \end{bmatrix} \qquad (10)$$

$$Y = \frac{1}{2}\begin{bmatrix} -1 & -j & -j & 1 \\ -j & 1 & -1 & -j \\ -j & -1 & 1 & -j \\ 1 & -j & -j & -1 \end{bmatrix} \qquad (11)$$

Referring back to FIG. 2, when a characteristic of the power amplification section 240 is constant at $B=\alpha I_{4\times4}$, (X,X), (X,Y), (Y,X) and (Y,Y) pairs all can be an example of a distributor-combiner matrix pair (A,C) that satisfies requirements of the power amplifier apparatus. After determining the matrix pair of the distributor and the combiner, input/output terminals corresponding to the unused sectors must be removed in order to satisfy Condition (1) as mentioned above.

B. Embodiments

In realizing a power pooling apparatus that satisfies power pooling conditions shown in Equation (4), Equation (5) and Equation (6), an important element is how to implement the distributor matrix and the combiner matrix of Equation (10) and Equation (11) as a distributor circuit and a combiner circuit. Embodiment of the present invention will be described in the following order. First, a 3 dB coupler for realization of a distributor/combiner constituting a power pooling apparatus according to the principle of the invention will be described with reference to FIGS. 3A and 3B. Second, exemplary structures of a distributor/combiner according to an embodiment of the present invention will be described with reference to FIGS. 4 and 5. Third, exemplary structures of a power pooling apparatus including a distributor/combiner of the invention will be described with reference to FIGS. 6 and 7. Fourth, a structure of an adaptive power pooling apparatus according to an embodiment of the present invention will be descried with reference to FIGS. 8 to 13. Finally, simulation results carried out on the power pooling apparatus according to an embodiment of the present invention will be described with reference to FIGS. 14A to 14D.

Figure 3A:
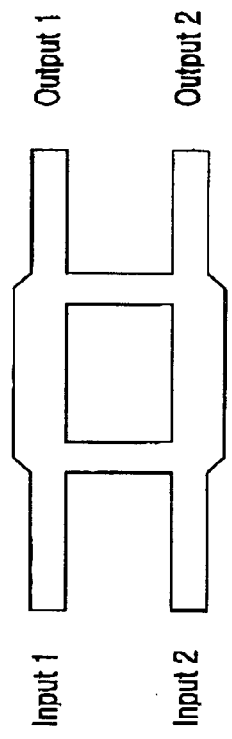
FIGS. 3A and 3B are block diagrams illustrating an example of a 3 dB coupler for implementation of a distributor/combiner illustrated in FIG. 2 according to an embodiment of the present invention.
Figure 3B:
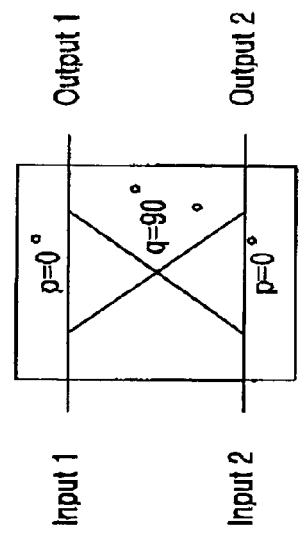

FIGS. 3A and 3B are block diagrams illustrating an example of a 3 dB coupler for implementation of a distributor/combiner illustrated in FIG. 2 according to an embodiment of the present invention. In realizing distributor and combiner circuits illustrated in FIGS. 3A and 3B, the most fundamental element is a coupler having two input terminals and two output terminals.

Referring to FIG. 3A, when a signal is applied to any one of two input terminals, the 3 dB coupler prevents the input signal from being applied to the other input terminal, and outputs the bisected input signals to its two output terminals. There is a specified phase difference between the two outputs, and there exist several kinds of couplers according to the phase difference. For example, when the phase difference is 90°, the coupler is called a 90° coupler, and when the phase difference is 180°, the coupler is called a 180° coupler. In the embodiment of the present invention, it will be assumed that the 3 dB coupler is a 90° coupler. However, the same implementation can be achieved even though a 180° coupler is used. A characteristic matrix G of the 90° coupler can be represented by $$G = \frac{1}{\sqrt{2}} \begin{bmatrix} 1 & -j \\ -j & 1 \end{bmatrix} \quad (12)$$

If an input is $$\underline{a} = \begin{bmatrix} a_1 \\ a_2 \end{bmatrix}$$

and an output determined after passing through the characteristic matrix G is $\underline{b}$, then the output becomes $$\underline{b} = \begin{bmatrix} a_1 \\ a_2 \end{bmatrix} = G\underline{a} = \frac{1}{\sqrt{2}} \begin{bmatrix} a_1 - ja_2 \\ -ja_2 + a_2 \end{bmatrix}.$$

When there is no correlation between the input and the output, a norm of the output for the input is $|a_1|^2+|a_2|^2$ and each element of b is identical in norm. That is, it is noted that a characteristic of the 90° 3 dB coupler is satisfied. For example, a 3 dB coupler is realized with a micro-strip line on a printed circuit board (PCB), and a 3 dB coupler of Equation (12) can be implemented by adjusting characteristic impedance and a length of the line.

A block diagram of the 3 dB coupler is illustrated in FIG. 3B, wherein p and q represent phase delays that a signal passing through corresponding paths suffers. In a 90° 3 dB coupler, p=0 and q=90.

Figure 4:
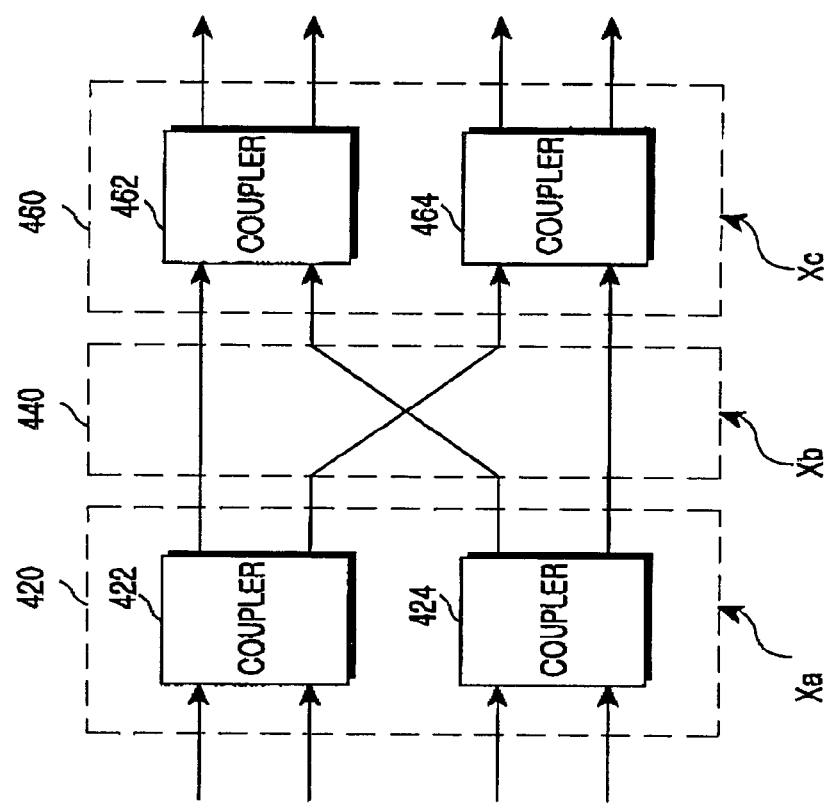
FIG. 4 is a block diagram illustrating an example of a distributor/combiner shown in FIG. 2 according to an embodiment of the present invention.

FIG. 4 is a block diagram illustrating an example of a distributor/combiner shown in FIG. 2 according to an embodiment of the present invention. Referring to FIG. 4, a distributor/combiner according to an embodiment of the present invention is comprised of coupler stacks 420 and 460 and a switching network 440, repeatedly connected in series. The coupler stack 420 has a coupler 422 and a coupler 424 connected in parallel, and the coupler stack 460 has a coupler 462 and a coupler 464 connected in parallel.

The first coupler 422 generates a first output signal and a second output signal by coupling a first input signal and a second input signal. The second coupler 424 generates a third output signal and a fourth output signal by coupling a third input signal and a fourth input signal. The third coupler 462 generates a fifth output signal and a sixth output signal by coupling a fifth input signal and a sixth input signal. The fourth coupler 464 generates a seventh output signal and an eighth output signal by coupling a seventh input signal and an eighth input signal. The switching network 440 provides the first output signal as the fifth input signal, the second output signal as the seventh input signal, the third output signal as the sixth input signal, and the fourth output signal as the eighth input signal.

FIG. 4 illustrates an embodiment of a distributor or a combiner realized using the matrix X shown in Equation (10). Such an embodiment can implement the distributor 220 and the combiner 260 of FIG. 2.

Since a characteristic matrix of the couplers 422 and 424 that can be implemented by the 3 dB coupler is $$\frac{1}{\sqrt{2}} \begin{bmatrix} 1 & -j \\ -j & 1 \end{bmatrix}$$

as mentioned above, a characteristic matrix $X_a$ of the coupler stack 420 comprised of the couplers 422 and 424 connected in parallel is represented by Equation (13) below. A characteristic matrix $X_c$ of the coupler stack 460 is also expressed as Equation (13). A characteristic matrix $X_b$ of the switching network 440 is represented by Equation (14) below.

$$X_a = X_c = \frac{1}{\sqrt{2}} \begin{bmatrix} 1 & -j & 0 & 0 \\ -j & 1 & 0 & 0 \\ 0 & 0 & 1 & -j \\ 0 & 0 & -j & 1 \end{bmatrix} \quad (13)$$

$$X_b = \begin{bmatrix} 1 & 0 & 0 & 0 \\ 0 & 0 & 1 & 0 \\ 0 & 1 & 0 & 0 \\ 0 & 0 & 0 & 1 \end{bmatrix} \quad (14)$$

Therefore, it is noted that a matrix determined by Equation (13) and Equation (14), i.e., an entire characteristic matrix for a distributor or a combiner illustrated in FIG. 4, becomes $X=X_c X_b X_a$ of Equation (10).

Figure 5:
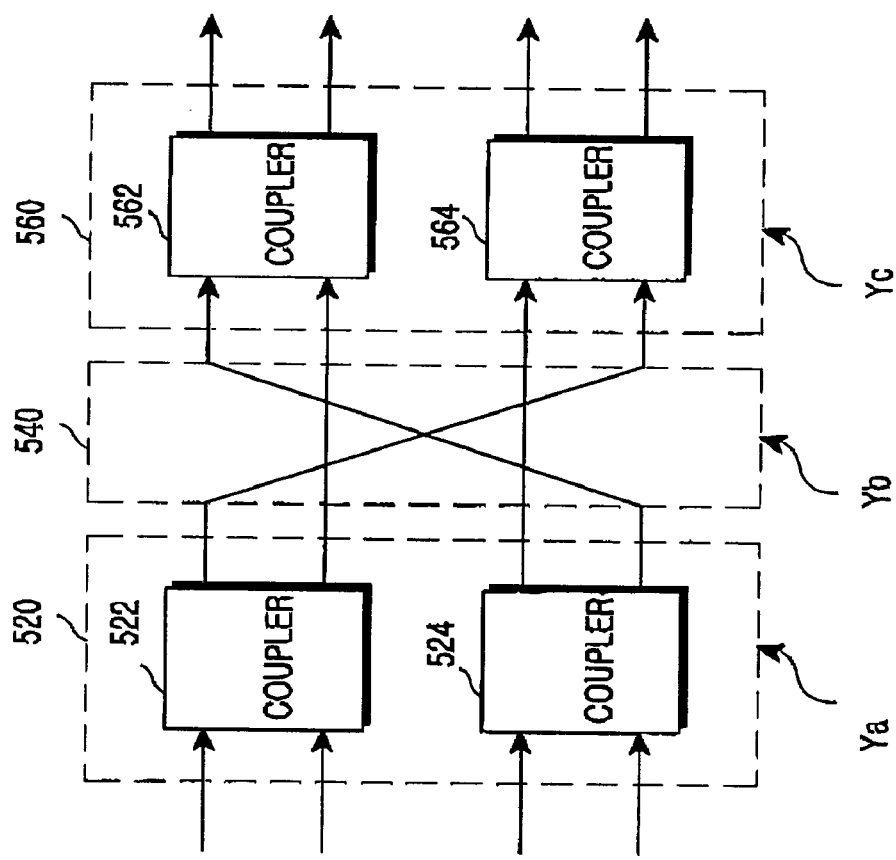
FIG. 5 is a block diagram illustrating another example of a distributor/combiner shown in FIG. 2 according to an embodiment of the present invention.

FIG. 5 is a block diagram illustrating another example of a distributor/combiner shown in FIG. 2 according to an embodiment of the present invention. Referring to FIG. 5, a distributor/combiner according to an embodiment of the present invention is comprised of coupler stacks 520 and 560 and a switching network 540, repeatedly connected in series. The coupler stack 520 has a coupler 522 and a coupler 524 connected in parallel, and the coupler stack 560 has a coupler 562 and a coupler 564 connected in parallel.

The first coupler 522 generates a first output signal and a second output signal by coupling a first input signal and a second input signal. The second coupler 524 generates a third output signal and a fourth output signal by coupling a third input signal and a fourth input signal. The third coupler 562 generates a fifth output signal and a sixth output signal by coupling a fifth input signal and a sixth input signal. The fourth coupler 564 generates a seventh output signal and an eighth output signal by coupling a seventh input signal and an eighth input signal. The switching network 540 provides the first output signal as the eighth input signal, the second output signal as the sixth input signal, the third output signal as the seventh input signal, and the fourth output signal as the fifth input signal.

Characteristic matrixes $Y_a$ and $Y_c$ of the coupler stacks 520 and 560 are equal to Equation (14) representing the characteristic matrixes $X_a$ and $X_c$, and a characteristic matrix $Y_b$ of the switching network 540 is given by $$Y_b = \begin{bmatrix} 0 & 0 & 0 & 1 \\ 0 & 1 & 0 & 0 \\ 0 & 0 & 1 & 0 \\ 1 & 0 & 0 & 0 \end{bmatrix} \quad (15)$$

Therefore, it can be noted that the entire characteristic matrix of the distributor or the combiner becomes $Y=Y_c Y_b Y_a$ of Equation (11).

Figure 6:
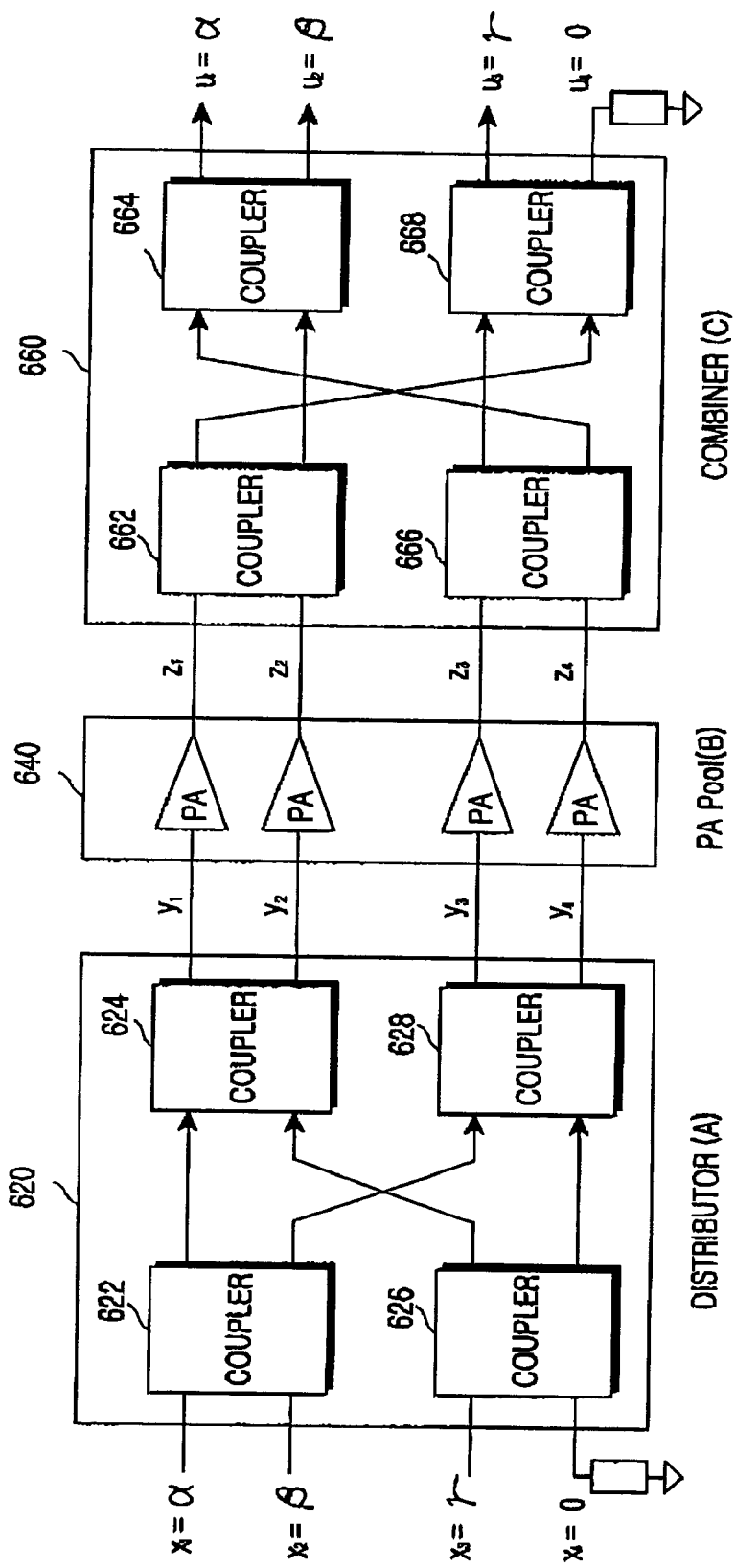
FIG. 6 is a block diagram illustrating an example of a power pooling apparatus according to an embodiment the present invention.

FIG. 6 is a block diagram illustrating an example of a power pooling apparatus according to an embodiment of the present invention. As illustrated in FIG. 4, a distributor 620 is formed of the matrix X of Equation (10), and as illustrated in FIG. 5, a combiner 660 is formed of the matrix Y of Equation (11). That is, the power pooling apparatus is formed of a matrix pair (X,Y) representing characteristics of the distributor 620 and the combiner 660. Here, the number N of power amplifiers is 4, and the number M of sectors is 3.

Referring to FIG. 6, sector input signals α, β and γ are applied to couplers 622 and 626 in the distributor 620. Specifically, the input signals α and β are coupled in the coupler 622, and then applied to rear couplers 624 and 628. The input signal γ and a ground signal are coupled through the coupler 626, and then applied to the rear couplers 624 and 628. That is, a first output signal of the coupler 622 is provided as a first input signal of the rear coupler 624, and a second output signal of the coupler 622 is provided as a first input signal of the rear coupler 628. A first output signal of the coupler 626 is provided as a second input signal of the rear coupler 624, and a second output signal of the coupler 626 is provided as a second input signal of the rear coupler 628. The rear couplers 624 and 628 couple the input signal components. Output signals $y_1$, $y_2$, $y_3$ and $y_4$ of the rear couplers 624 and 628 in the distributor 620 have uniform power levels. A first output signal $y_1$ and a second output signal $y_2$ of the coupler 624 and a first output signal $y_3$ and a second output signal $y_4$ of the coupler 628 are applied to respective power amplifiers in a power amplification section 640, and then output as power-amplified signals.

Output signals $z=[z_1,z_2,z_3,z_4]$ of respective power amplifiers in the power amplification section 640 are applied to the combiner 660. Of the signals applied to the combiner 660, $z_1$ and $z_2$ are applied to a coupler 662, and $Z_3$ and $z_4$ are applied to a coupler 666. That is, a first output signal of the coupler 662 is provided as a second input signal of a rear coupler 668, and a second output signal of the coupler 662 is provided as a second input signal of a rear coupler 664. A first output signal of the coupler 666 is provided as a first input signal of the rear coupler 668, and a second output signal of the coupler 666 is provided as a first input signal of the rear coupler 664. The rear couplers 664 and 668 output coupled signals $u_1=\alpha$, $u_2=\beta$, $u_3=\gamma$ and $u_4=0$ by coupling the input signals. The outputs provided through the distributor 620, the power amplification section 640 and the combiner 660 satisfy Condition (1) to Condition (4), and a detailed description thereof will be made below with reference to FIG. 7.

Figure 7:
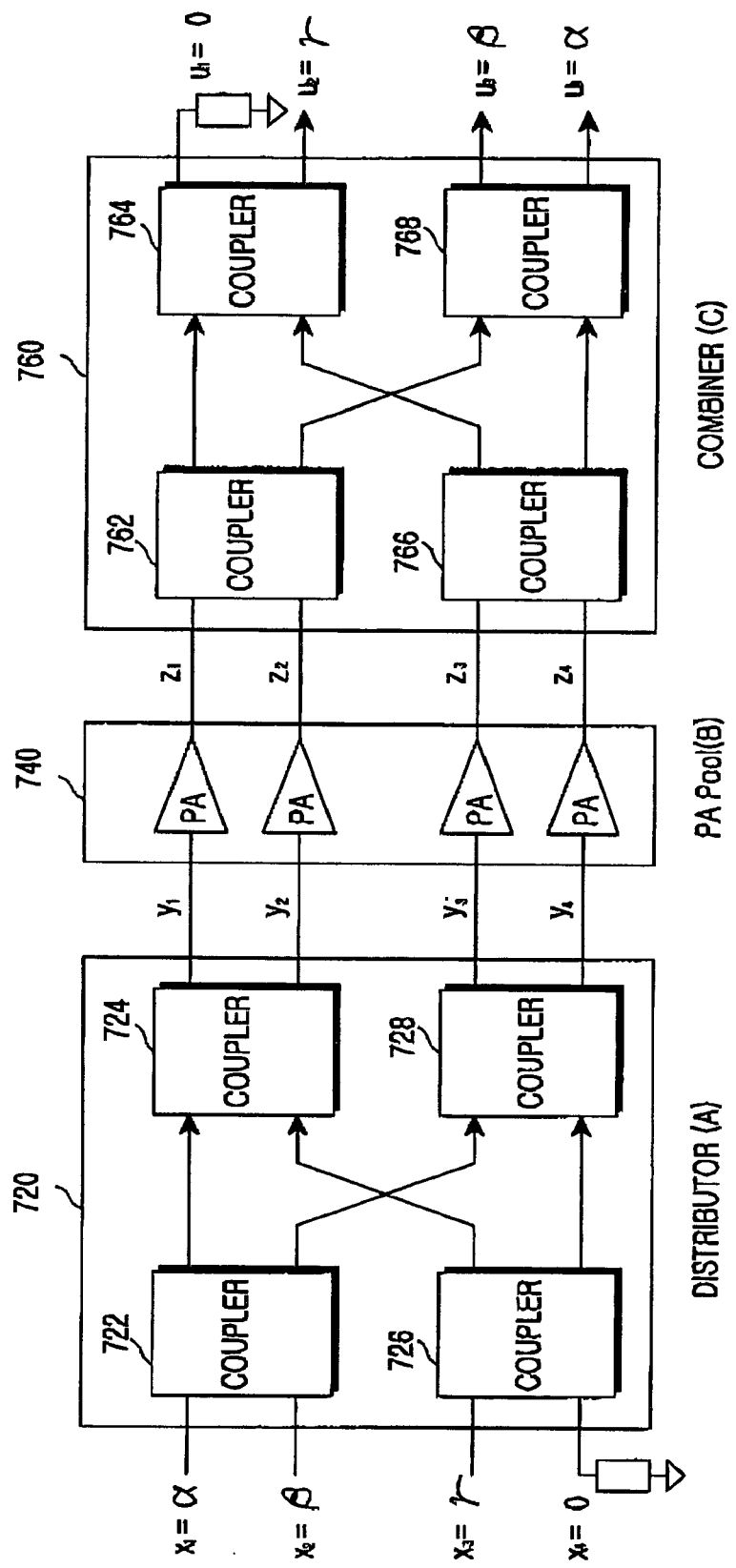
FIG. 7 is a block diagram illustrating an example of a power pooling apparatus according to another embodiment of the present invention.

FIG. 7 is a block diagram illustrating an example of a power pooling apparatus according to another embodiment of the present invention. As described in conjunction with FIG. 4, a distributor 720 and a combiner 760 in the power pooling apparatus are formed of only the matrix X of Equation (10). That is, a matrix pair representing characteristics of the distributor 720 and the combiner 760 is (X,X). Here, the number N of power amplifiers is 4, and the number M of sectors is 3.

Referring to FIG. 7, sector input signals α, β and γ are applied to couplers 722 and 726 in the distributor 720. Specifically, the input signals α and β are coupled in the coupler 722, and then applied to rear couplers 724 and 728. The input signal γ and a ground signal are coupled through the coupler 726, and then applied to the rear couplers 724 and 728. That is, a first output signal of the coupler 722 is provided as a first input signal of the rear coupler 724, and a second output signal of the coupler 722 is provided as a first input signal of the rear coupler 728. A first output signal of the coupler 726 is provided as a second input signal of the rear coupler 724, and a second output signal of the coupler 726 is provided as a second input signal of the rear coupler 728. The rear couplers 724 and 728 couple the input signal components. Output signals $y_1$, $y_2$, $y_3$ and $y_4$ of the rear couplers 724 and 728 in the distributor 720 have uniform power levels. A first output signal $y_1$ and a second output signal $y_2$ of the coupler 724 and a first output signal $y_3$ and a second output signal $y_4$ of the coupler 728 are applied to respective power amplifiers in a power amplification section 740, and then output as power-amplified signals.

Output signals $z=[z_1,z_2,z_3,z_4]$ of respective power amplifiers in the power amplification section 740 are applied to the combiner 760. Of the signals applied to the combiner 760, $z_1$ and $z_2$ are applied to a coupler 762, and $z_3$ and $z_4$ are applied to a coupler 766. That is, a first output signal of the coupler 762 is provided as a first input signal of a rear coupler 764, and a second output signal of the coupler 762 is provided as a first input signal of a rear coupler 768. A first output signal of the coupler 766 is provided as a second input signal of the rear coupler 764, and a second output signal of the coupler 766 is provided as a second input signal of the rear coupler 768. The rear couplers 764 and 768 output coupled signals $u_1=\alpha$, $u_2=\beta$, $u_3=\gamma$ and $u_4=0$ by coupling the input signals. The outputs provided through the distributor 720, the power amplification section 740 and the combiner 760 satisfy Condition (1) to Condition (4), and a detailed description thereof will be made herein below.

FIG. 7 illustrates a power amplification apparatus made by selecting a matrix pair of the distributor 720 and the combiner 760 as (X,X) of Equation (10) on the assumption that the power amplification section 740 has a constant gain $\alpha$ and its amplification characteristic is $B=\alpha I_{4\times 4}$. When a sector input vector is $\underline{x}=[\alpha\beta\gamma\delta]^T$ ($\delta=0$), an input vector of the power amplification section 740 is $\underline{y}=X\underline{x}$. Therefore, if the matrix X of Equation (10) is substituted into $\underline{y}=X\underline{x}$, the input vector becomes $$v = \begin{bmatrix} y_1 \\ y_2 \\ y_3 \\ y_4 \end{bmatrix} = \frac{1}{2} \begin{bmatrix} \alpha - j\beta - j\gamma \\ -j\alpha - \beta + \gamma \\ -j\alpha + \beta - \gamma \\ -\alpha - j\beta - j\gamma \end{bmatrix} \qquad (16)$$

Since it is assumed that there is no correlation between respective sector input signals as mentioned above, every element of $\underline{y}$ has the same power of $$\frac{1}{4}(|\alpha|^2 + |\beta|^2 + |\gamma|^2).$$

That is, the entire power ($|\alpha|^2+|\beta|^2+|\gamma|^2$) of the sector input signals is uniformly distributed to four power amplifiers. Even though sector input signals are non-uniform in amplitude (for example, $|\alpha|^2>|\beta|^2>|\gamma|^2$), signals provided from the distributor 720 to the power amplification section 740 are identical in power. Therefore, Condition (3), uniform amplification requirement of power amplifiers, is satisfied.

If it is assumed that a characteristic of the power amplification section 740 is constant at $B=\alpha I_{4\times 4}$, an output of the power amplification section 740 is calculated by $$z = \begin{bmatrix} z_1 \\ z_2 \\ z_3 \\ z_4 \end{bmatrix} = B\underline{v} = \alpha I \cdot \underline{v} = \frac{1}{2}\alpha \begin{bmatrix} \alpha - j\beta - j\gamma \\ -j\alpha - \beta + \gamma \\ -j\alpha + \beta - \gamma \\ -\alpha - j\beta - j\gamma \end{bmatrix} \qquad (17)$$

When the power pooling apparatus is realized by selecting a matrix pair of the distributor 720 and the combiner 760 as (X,X) as illustrated in FIG. 7, a signal output from a final output stage, provided after passing through the combiner 760, is given by $$\underline{u} = Cz = C\frac{1}{2}\alpha \begin{bmatrix} \alpha - j\beta - j\gamma \\ -j\alpha - \beta + \gamma \\ -j\alpha + \beta - \gamma \\ -\alpha - j\beta - j\gamma \end{bmatrix} = \frac{1}{2}\alpha \begin{bmatrix} 1 & -j & -j & -1 \\ -j & -1 & 1 & -j \\ -j & 1 & -1 & -j \\ -1 & -j & -j & 1 \end{bmatrix} \cdot \begin{bmatrix} \alpha - j\beta - j\gamma \\ -j\alpha - \beta + \gamma \\ -j\alpha + \beta - \gamma \\ -\alpha - j\beta - j\gamma \end{bmatrix} = \alpha \begin{bmatrix} 0 \\ -\gamma \\ -\beta \\ -\alpha \end{bmatrix} \qquad (18)$$

The entire characteristic of the power pooling apparatus determined by considering a phase variation and a variation in sector output order at an output stage of the power pooling apparatus according to an embodiment of the present invention becomes $$CBA = \alpha \begin{bmatrix} 0 & 0 & 0 & -1 \\ 0 & 0 & -1 & 0 \\ 0 & -1 & 0 & 0 \\ -1 & 0 & 0 & 0 \end{bmatrix} = \alpha QPI \qquad (19)$$

$$\text{where } Q = \begin{bmatrix} 0 & 0 & 0 & 1 \\ 0 & 0 & 1 & 0 \\ 0 & 1 & 0 & 0 \\ 1 & 0 & 0 & 0 \end{bmatrix} \text{ and } P = \begin{bmatrix} e^{j\pi} & 0 & 0 & 0 \\ 0 & e^{j\pi} & 0 & 0 \\ 0 & 0 & e^{j\pi} & 0 \\ 0 & 0 & 0 & e^{j\pi} \end{bmatrix}.$$

Therefore, it can be understood that since Equation (19) satisfies Equation (7), Condition (2) is satisfied. Summarizing, when the power pooling apparatus is constructed as illustrated in FIG. 7 (3-sector, 4-power amplifier system), there are 3 (M=3) sector inputs and 4 (N=4) power amplifiers. Here, unused input/output terminals are grounded. Therefore, the power pooling apparatus of FIG. 7 satisfies Condition (1), satisfies Condition (2) as $CBA=\alpha QPI_{4\times 4}$, satisfies Condition (3) as $|c_{ij}|=$(const) for every i,j for every i and j, and satisfies Condition (4) as $CC^H=I$, thereby satisfying every requirement stated above.

The foregoing description is made to prove the fact that the proposed power pooling apparatus of FIG. 7 satisfies Condition (1) to Condition (4) by using a matrix pair (X,X) of Equation (10). This can also be applied to the fact that the proposed power pooling apparatus of FIG. 6 satisfies Condition (1) to Condition (4) by using a matrix pair (X,Y) of Equation (10) and Equation (11). The above embodiments of the power pooling apparatus are applied on condition that a transfer characteristic matrix B of the power amplification section is ideal. However, when the transfer characteristic matrix B of the power amplification section is not ideal, an actual power amplification section is not uniform in its amplification characteristic, thus showing different amplitude and phase characteristics according to system. In addition, since the power amplification section may be failed during operation and a linear power amplifier (LPA) may be affected by noises in a gain linearization process, it is difficult to apply the embodiments in such a dynamic environment. Moreover, since the distributor and the combiner arranged before and after the power amplification section are both passive elements having fixed characteristics, when an amplification characteristic of the power amplification section suffers a change, it is not possible to properly compensate for the change.

Therefore, in the following description, it will be assumed that the power pooling apparatus according to an embodiment of the present invention is an adaptive power pooling apparatus which is a realistic power pooling apparatus, not an ideal power pooling apparatus.

Figure 8:
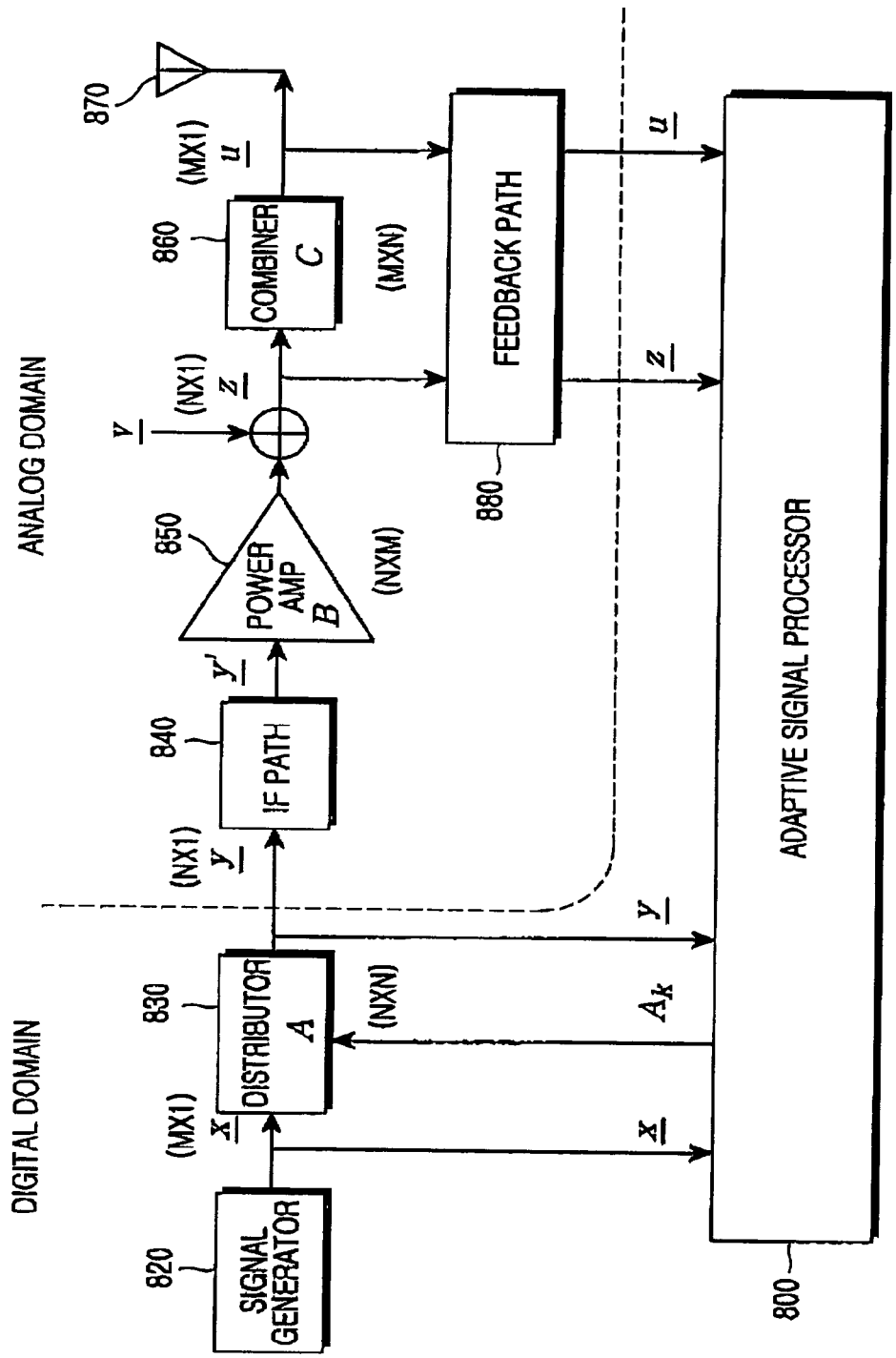
FIG. 8 is a block diagram illustrating an example of an antenna system including an adaptive power pooling apparatus according to an embodiment of the present invention.

FIG. 8 is a block diagram illustrating an example of an antenna system including an adaptive power pooling apparatus according to an embodiment of the present invention.

Referring to FIG. 8, the adaptive power pooling apparatus according to the principle of the invention includes an adaptive signal processor 800, a signal generator 820, an intermediate frequency (IF) path 840 and a feedback path section 880 in addition to the cascade structure of a distributor 830, a power amplification section 850 and a combiner 860. In FIG. 8, $\underline{v}$ refers to a noise vector of the power amplification section 850.

The adaptive signal processor 800 receives output signals of the signal generator 820, output signals of the distributor 830, output signals of the power amplification section 850, and output signals of the combiner 860. The adaptive signal processor 800 provides a control matrix value $A_k$ to the distributor 830 using an adaptive algorithm which will be described later.

The signal generator 820 generates independent digital signals of respective sectors, and outputs a sector input vector $\underline{x}$ consisting of the generated digital signals. Herein, any one of frequency division multiple access (FDMA), time division multiple access (TDMA) and code division multiple access (CDMA) can be used as a signaling scheme. The distributor 830 multiplies the sector input vector by a distributor's characteristic matrix value calculated by the adaptive signal processor 800 in a previous step, and outputs an output vector $\underline{y}$ consisting of output signals of the distributor 830. The IF path 840 is comprised of a digital-to-analog converter and a frequency-up converter (both not shown). The IF path 840 is a path for converting a digital signal into an analog signal. The output vector $\underline{y}$ of the distributor 830 is converted by the IF path 840 into a power amplification section's input vector $\underline{y}'$ consisting of power amplification section's input signals which are RF analog signals. The $\underline{y}$ and the $\underline{y}'$ are identical in amplitude and phase. However, in the event that $\underline{y}$ and the $\underline{y}'$ are different in amplitude and phase, they can be made identical in amplitude and phase by changing a characteristic of the power amplification section 850. Therefore, in the following description, the term "input vector" of the power amplification section 850 refers to $\underline{y}$ or $\underline{y}'$.

The power amplification section 850 amplifies the power amplification section's input vector $\underline{y}$ by a predetermined value, and outputs a power amplification section's output vector $\underline{z}$ consisting of the power amplification section's output signals. The combiner 860 combines the power amplification section's output vectors, and outputs a sector output vector $\underline{u}$ consisting of sector output signals. The sector output vector is transmitted through antennas 870 of respective sectors. The feedback path section 880 converts RF analog signals $\underline{z}$ and $\underline{u}$ into baseband digital signals, and provides converted digital signals to the adaptive signal processor 800. The adaptive power pooling apparatus realizes the distributor and the combiner having optimum distributing and combining characteristics for power pooling by an adaptive algorithm.

Even the adaptive power pooling apparatus applies Equation (1) to Equation (5) so as to satisfy Condition (3) and Condition (4). A characteristic matrix C of the combiner 860 is so selected as to satisfy Equation (4) and Equation (5). When the characteristic matrix C is selected, the combiner 860 can determine D by Equation (2) and determine A by Equation (1). However, since a characteristic of B is apt to suffer a change, there is a necessity to estimate the characteristic of B every time. When the characteristic of B is determined, A is determined by Equation (20) below based on Equation (1) and Equation (2).

$$A = \alpha B^{-1} C^{-1} \quad (20)$$

The determined distributor's matrix A becomes a transfer characteristic matrix that controls the distributor so as to satisfy Condition (2). Finally, in order to satisfy Condition (1), input/output terminals corresponding to unused sectors are removed. By removing the input/output terminals for the unused sectors, the distributor's characteristic matrix A and the combiner's characteristic matrix C are restored to their original N-by-M distributor's matrix A and M-by-N combiner's matrix C, so Equation (20) should be modified into Equation (21) below. Therefore, the distributor's matrix A is calculated by Equation (21).

$$A = \alpha B^{-1} C^{+} \quad (21)$$

In Equation (21), $(\bullet)^+$ is a pseudo-inverse operator. The pseudo-inverse operator is calculated with Equation (23) below when the number of columns is larger than the number of rows. In the specification, a $(\bullet)^+$ type matrix is defined as a pseudo-inverse matrix.

When a characteristic matrix at each stage at a $k^{th}$ time is considered, a distributor's characteristic matrix $A_{K+1}$ to be used at the next time by Equation (20) and Equation (21) is calculated by $$A_{k+1} = \alpha B^{-1}_k C^{-1}_k \text{ or } A_{k+1} = \alpha B^{-1}_k C^{+}_k \quad (22)$$

That is, while the distributor's characteristic matrix $A_{K+1}$ to be used at the next time by Equation (20) is determined as $A_{k+1} = \alpha B^{-1}_k C^{-1}_k$, a distributor's characteristic matrix $A_{K+1}$ at a $k^{th}$ time is calculated as $A_{k+1} = \alpha B^{-1}_k C^{+}_k$ for the pseudo-inverse operator calculated when the number of columns is larger than the number of rows. For a characteristic matrix provided by the adaptive signal processor to uniformly distribute input signals by using an adaptive algorithm, a distributor's characteristic matrix provided at a $k^{th}$ time is referred to as a control matrix and a distributor's characteristic matrix provided at a $(k+1)^{th}$ time is referred to as a next distributor's characteristic matrix.

Equation (23) below is a formula of the pseudo-inverse operator.

$$C^{+} = C^{H}(CC^{H})^{-1} \quad (23)$$

where $(\bullet)^H$ is a Hermitian (conjugate transpose) operator.

The proposed adaptive power pooling method that satisfies Condition (1) to Condition (4) includes the following steps.

Step 1: the number of power amplifiers larger than the number of sectors by 1 or more is determined to satisfy Condition (1).

Step 2: a combiner's characteristic matrix C with $CC^H=I$ and $|C_{ij}|=(const)$ is determined to satisfy Condition (3) and Condition (4).

Step 3: a power amplification section's characteristic matrix B is estimated.

Step 4: a distributor's matrix A is determined by Equation (22) and then Step 3 is repeated to satisfy Condition (2).

Step 3 and Step 4 can be considered as an estimation step and a control step, respectively. The adaptive power pooling algorithm proposed by the invention through these steps can be considered as repetition of a process of occasionally estimating a power amplification section's transfer characteristic matrix and adapting a distributor's transfer characteristic matrix value in order to satisfy desired conditions based on the estimation result. That is, input signals are distributed by determining a distributor's transfer characteristic matrix value at a $(k+1)^{th}$ time by estimating a power amplification section's transfer characteristic matrix at a $k^{th}$ time, updating a characteristic matrix at the $k^{th}$ time as a characteristic matrix at the $(k+1)^{th}$ time, and using the updated characteristic matrix at the $(k+1)^{th}$ time. When the combiner is implemented with a passive element, a variation in its characteristic is not drastic according to time as compared with when the combiner is realized with an active element. However, since the characteristic may be changed according to temperature and circumstances in the long term, it is also necessary to estimate a combiner's characteristic matrix C for more correct power pooling. In this case, a process of estimating C can be included in Step 3.

A description will now be made of a method for estimating a power amplification section's transfer characteristic matrix B and a combiner's transfer characteristic matrix C, proposed by the present invention. In order to show change with time, a time index k will be put on each parameter as a subscript.

A power amplification section's transfer characteristic $B_K$ can be estimated from power amplification section's input/output vectors $\underline{y}_k 32\ [y_{1,k}, \ldots, y_{N,k}]$ and $\underline{z}_k = [z_{1,k}, \ldots, z_{N,k}]$, and since $B_K$ is a diagonal matrix as $B_K = \text{diag}(b_{1,k}, \ldots, b_{N,k})$ in view of the system configuration, it is possible to separately estimate the power amplifier's characteristics $b_{1,k}, \ldots, b_{N,k}$. As an estimation method, a least squares method for finding an optimum power amplification section's characteristic with least squares by using all present and past power amplifier's input/output values is applied. Particularly, a recursive least squares method (RLS) having a forgetting factor to obtain an estimation value adapted to the current environment is applied. The "least squares method" refers to an optimization method well known in a signal processing field (see Haykin "Adaptive Filter Theory" Prentice Hall 1991 which is incorporated herein by reference). A cost function $G(b_{i,k})$ for an estimation value $b_{i,k}$ at a $k^{th}$ time of an $i^{th}$ amplifier in the power amplification section can be expressed as $$G(b_{i,k}) = \sum_{j=1}^{k} \lambda^{k-j} \left| z_{i,j} - b_{i,k} y_{i,j} \right|^2 \quad (24)$$

The recursive least squares method is used in order to calculate $b_{i,k}$ that minimizes the cost function. Each element value of a distributor's diagonal matrix can be found with the calculated $b_{i,k}$.

$$b_{i,k} = b_{i,k-1} + (z_{i,k} - b_{i,k} y_{i,k}) y_{i,k}^* \frac{1}{P_{i,k}} \quad (25)$$
$$P_{i,k} = \lambda P_{i,k-1} + |y_{i,k}|^2$$

In Equation (25), initialization is performed so that $b_{i,0} = \tilde{b}_i$ and $P_{i,0} = 0$, and the $\tilde{b}_i$ is a norminal value. In addition, $\lambda$ is a forgetting factor introduced to perform estimation by properly forgetting a contribution component of a past measurement value and applying a higher ratio to a current measurement value, and has a value between 0 and 1. Thus in an extreme case, if $\lambda=1$, all past values and current values are reflected in the same ratio. Commonly, some 10 to 100 memories are provided by selecting $\lambda=0.9$ to 0.99.

A combiner's transfer characteristic $C_k$ at a $k^{th}$ time can be estimated from combiner's input/output vectors $\underline{z}_k$ and $\underline{u}_k$, and also, as an estimation method, the recursive least squares method for estimating an optimum value of a combiner's characteristic with least squares by using all current and past combiner's input/output values is applied.

A cost function for a combiner's estimation value $C_k$ at a current $k^{th}$ time can be selected by $$H(C_k) = \sum_{j=1}^{k} \lambda^{k-j} \left\| \underline{u}_j - C_k \underline{z}_j \right\|^2 \quad (26)$$

In Equation (26), the $C_k$ that minimizes the cost function can be recursively calculated by $$C_k = C_{k-1} + \left( \underline{u}_k - C_{k-1} \underline{z}_k^H \frac{Q_{k-1}}{\underline{z}_k^H Q_{k-1} \underline{z}_k + \lambda} \right) \quad (27)$$
$$Q_k = \lambda^{-1} \left( Q_{k-1} - \frac{Q_{k-1} \underline{z}_k \underline{z}_k^H Q_{k-1}}{\underline{z}_k^H Q_{k-1} \underline{z}_k + \lambda} \right)$$

In Equation (27), initialization is performed so that $C_0 = \tilde{C}$ and $Q_0 = \delta 1$ (where $\delta$ is a value large enough), and $\tilde{C}$ is a norminal value of C.

Figure 9:
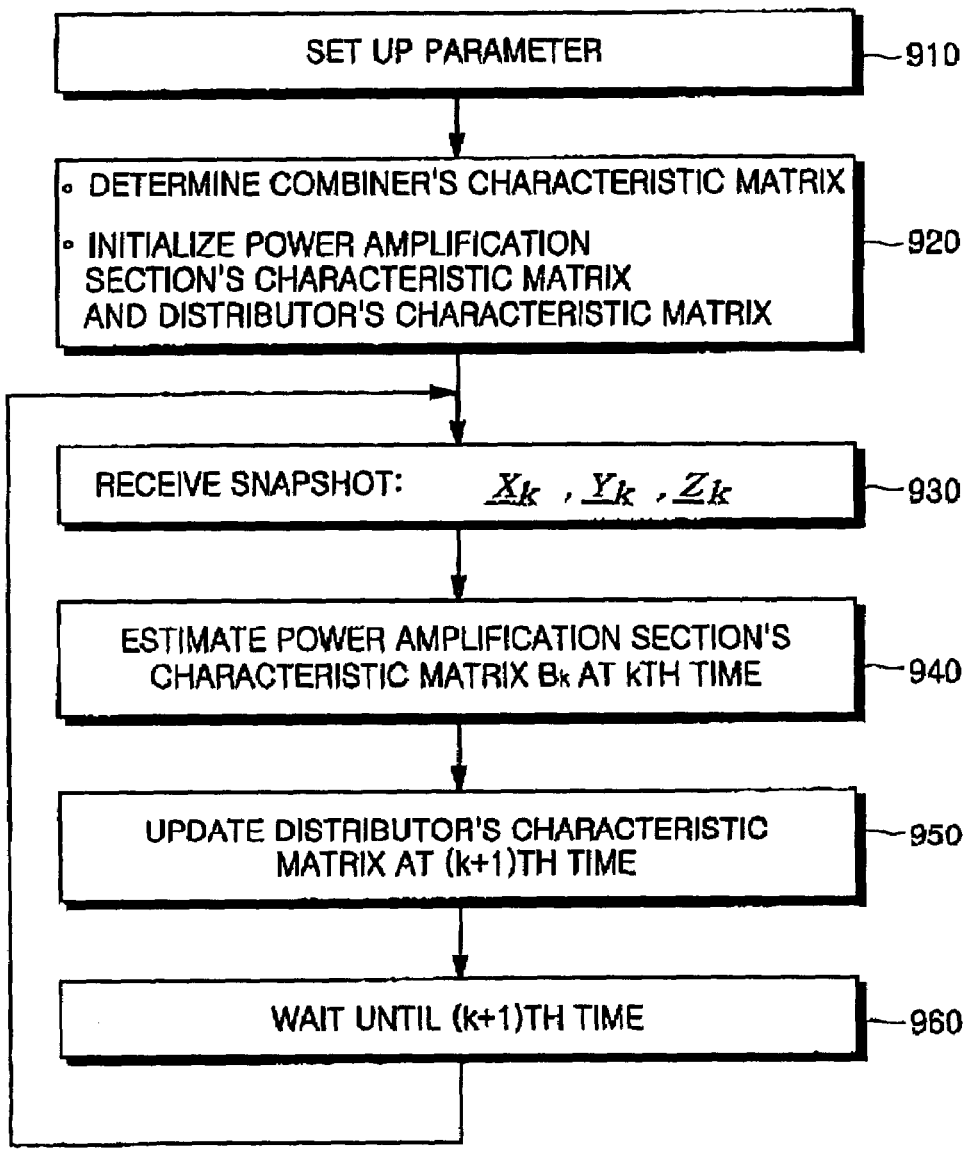
FIG. 9 is a flowchart illustrating an example of a process for estimating a transfer characteristic matrix of the power amplification section illustrated in FIG. 8 according to an embodiment of the present invention.

FIG. 9 is a flowchart illustrating an example of a process for estimating a transfer characteristic matrix of the power amplification section illustrated in FIG. 8 according to an embodiment of the present invention. Specifically, an operation of estimating a transfer characteristic matrix of the power amplification section 850 according to the flowchart is performed by the adaptive signal processor 800 of FIG. 8.

Referring to FIG. 9, in step 910, the adaptive signal processor 800 sets up such parameters as the number M of power amplifiers in the power amplification section, the number M of sectors, a desired gain $\alpha$ of the power amplification section and a forgetting factor $\lambda$, so as to satisfy Condition (1). In step 920, the adaptive signal processor 800 determines a combiner's characteristic matrix satisfying Equation (4) and Equation (5) in order to satisfy Condition (3) and Condition (4), initializes norminal power amplification section's characteristic matrix $B_0$ so as to obtain a nominal power amplification section's gain $\alpha$ in order to estimate a power amplification section's characteristic matrix B, and initializes a distributor's transfer characteristic matrix to $A_1 = C^{-1}$. If the number of columns of the matrix is larger than the number of rows, the distributor's transfer characteristic matrix is initialized to $A_1 = C^+$. In step 930, the adaptive signal processor 800 receives power amplification section's input/output vectors $\underline{y}_k$ and $\underline{z}_k$ at a $k^{th}$ time, and a distributor's input signal $\underline{x}_k$ at the $k^{th}$ time. In step 940, the adaptive signal processor 800 estimates $b_{i,k}$ by applying Equation (24) and Equation (25). Since $B_k$ is a diagonal matrix as mentioned above, a power amplification section's characteristic matrix is estimated by calculating an estimation value of the $b_{i,k}$. In step 950, the adaptive signal processor 800 calculates a next distributor's control matrix $A_{k+1}$ by Equation (22) using the estimated characteristic matrix $B_k$. Thereafter, in step 960, the adaptive signal processor 800 waits until a $(k+1)^{th}$ time, the next time of the $k^{th}$ time, and then returns to step 930 to repeat the above process.

Figure 10:
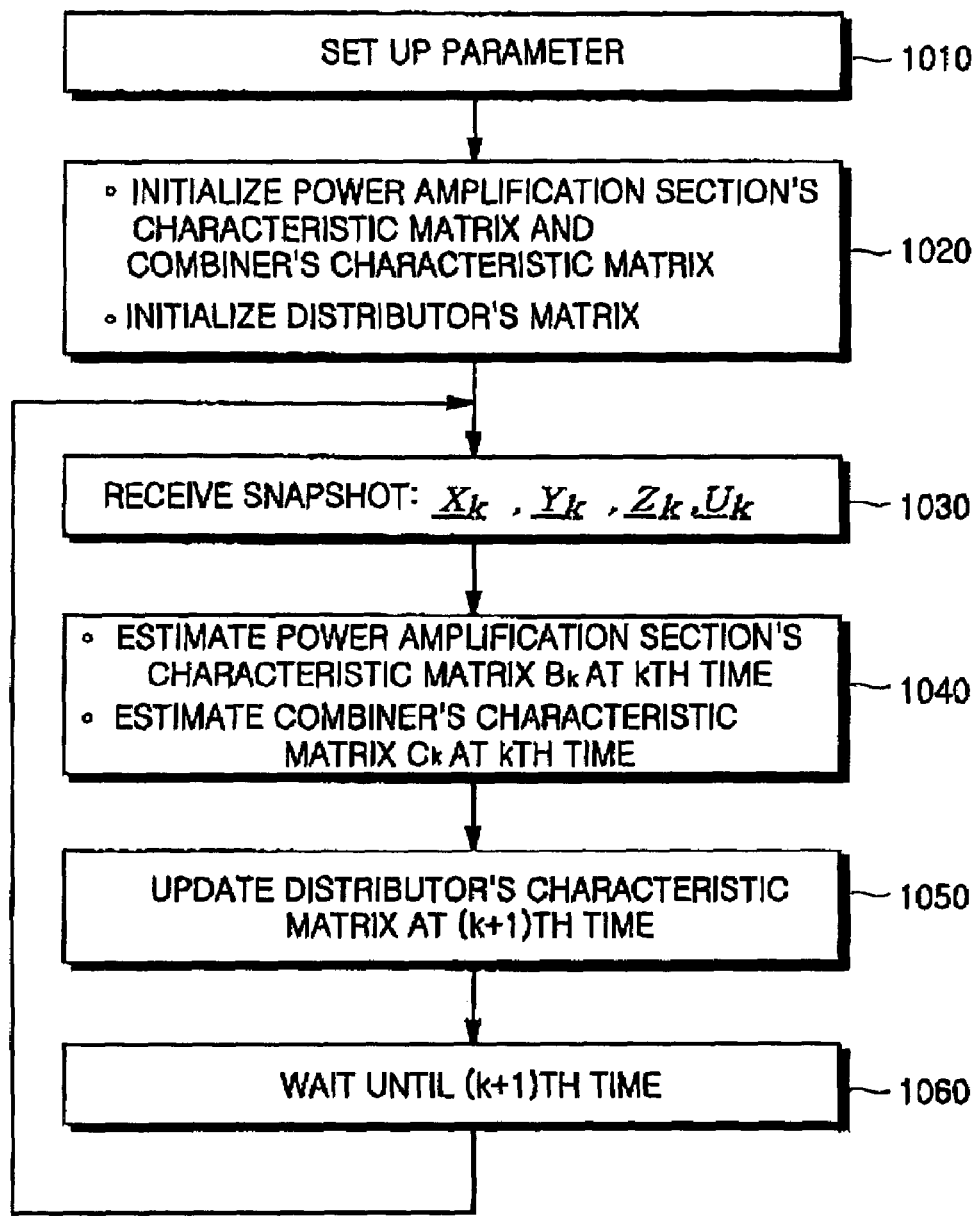
FIG. 10 is a flowchart illustrating an example of a process for estimating a power amplification section's transfer characteristic matrix and a combiner's transfer characteristic matrix illustrated in FIG. 8 according to an embodiment of the present invention.

FIG. 10 is a flowchart illustrating an example of a process for estimating a power amplification section's transfer characteristic matrix and a combiner's transfer characteristic matrix illustrated in FIG. 8 according to an embodiment of the present invention. Referring to FIG. 10, in step 1010, the adaptive signal processor 800 sets up such parameters as the number M of sectors, the number N of power amplifiers, a gain $\alpha$ of a desired power amplifier and a forgetting factor λ, so as to satisfy Condition (1). In step 1020, the adaptive signal processor 800 initializes $B_0$ having a norminal power amplifier's gain, initializes $C_0$ so as to satisfy Equation (4) and Equation (5) in order to satisfy Condition (3) and Condition (4), and initializes a distributor's transfer characteristic matrix to $$A_1 = C_0^{-1}.$$

If the number of columns of the matrix is larger than the number of rows, the distributor's transfer characteristic matrix is initialized to $A_1 = C^+$. In step 1030, the adaptive signal processor 800 receives power amplification section's input/output vectors and a distributor's input vector at a $k^{th}$ time. In step 1040, the adaptive signal processor 800 adaptively estimates a power amplification section's characteristic matrix and a combiner's characteristic matrix by applying Equation (24), Equation (25), Equation (26) and Equation (27). In step 1050, the adaptive signal processor 800 calculates a next distributor's transfer characteristic matrix by Equation (22) using the estimated matrix values $B_k$ and $C_k$. Thereafter, in step 1060, the adaptive signal processor 800 waits until a $(k+1)^{th}$ time, the next time of the $k^{th}$ time, and then returns to step 1030 to repeat the above process.

Figure 11:
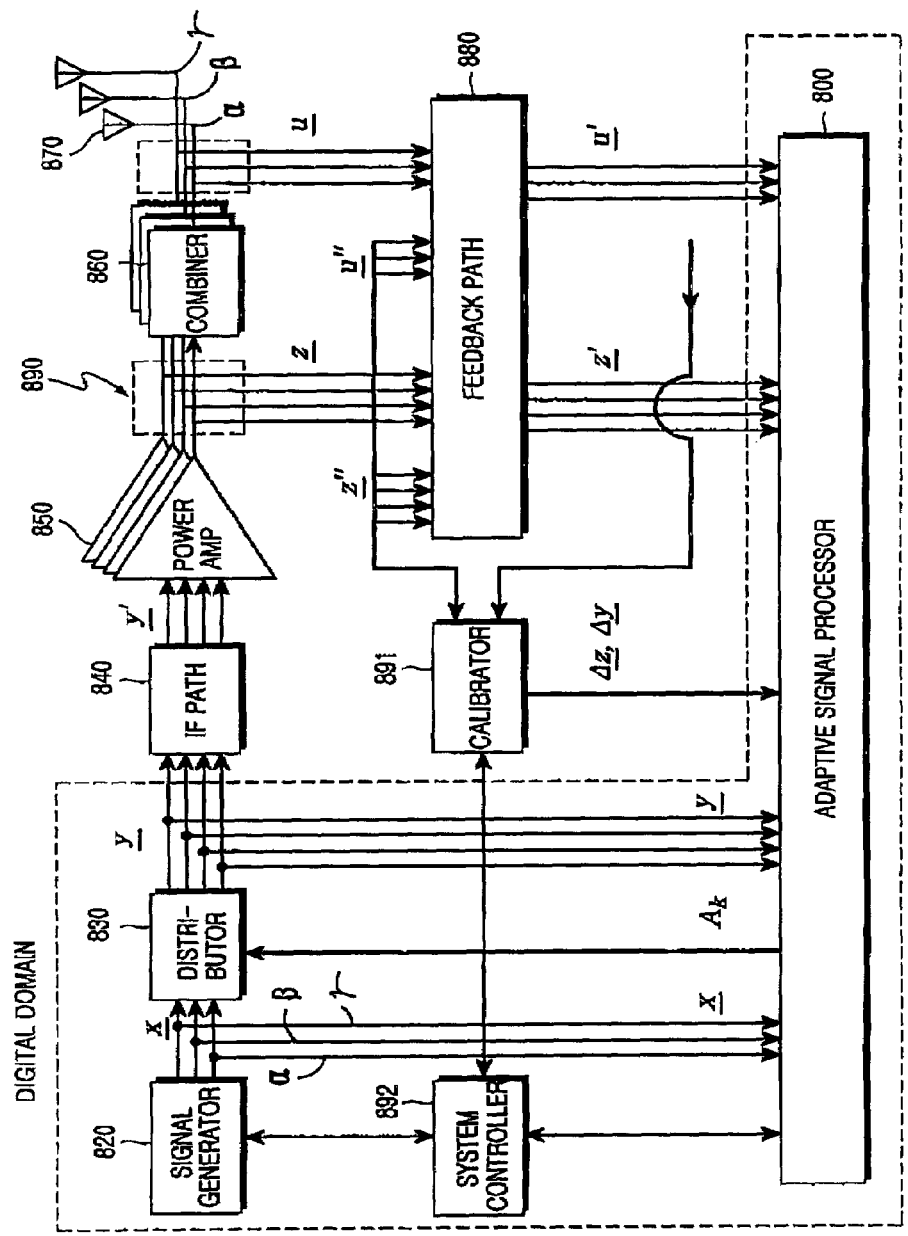
FIG. 11 is a block diagram illustrating an example of an adaptive power pooling apparatus according to an embodiment of the present invention.

FIG. 11 is a block diagram illustrating an example of an adaptive power pooling apparatus according to an embodiment of the present invention. In an embodiment of the present invention FIG. 11 takes into consideration the number of sectors and the number of power amplifiers and includes a system controller 892, a calibrator 891 and a coupler 890 in addition to the power pooling apparatus of FIG. 8.

The adaptive signal processor 800, the signal generator 820, the distributor 830 and the system controller 892 operate in a digital domain. The IF path 840, the power amplification section 850, the combiner 860, the antennas 870, the coupler 890 and the feedback path section 880 operate in an analog domain. The calibrator 891 operates in both the digital domain and the analog domain.

It is assumed in FIG. 11 that the number of cells α, β and γ serviced by one base station is 3, i.e., the number M of sectors is 3 (M=3), and the power amplification section 850 has 4 (N=4) power amplifiers including one redundant power amplifier.

The signal generator 820 generates independent digital signals α, β and γ of respective sectors, and outputs a sector input vector $\underline{x}=[\alpha,\beta,\gamma]^T$ consisting of the generated digital signals. The distributor 830 multiplies the sector input vector a distributor's control matrix value $A_k$ calculated by the adaptive signal processor 800 in a previous step, and outputs a distributor's output vector $\underline{y}$. However, it is noted that since a redundant power amplifier is used, the number of distributor's output elements is 4, which is larger by 1 than the number 3 of distributor's input elements. The power amplification section's input vector $\underline{y}'$ is increased by a predetermined value through the power amplification section 850 and output as a power amplification section's output vector $\underline{z}$, and the power amplification section's output signals are combined again through the combiner 860 and output as a sector output vector $\underline{u}$. The sector output vector $\underline{u}$ is radiated to the respective sectors α, β and γ via the sector antennas 870. In order to calculate the next distributor's control matrix $A_{k+1}$, the adaptive signal processor 800 requires the sector input vector $\underline{x}$, the power amplification section's input vector $\underline{y}$, the power amplification section's output vector $\underline{z}$, and the combiner's output vector $\underline{u}$. Since the adaptive signal processor 800 operates in a digital domain, it has no difficulty in receiving the digital signals $\underline{x}$ and $\underline{y}$, but special consideration should be taken in receiving the RF analog signals $\underline{z}$ and $\underline{u}$. An embodiment of the present invention includes the feedback path section 880 to convert the RF analog signals $\underline{z}$ and $\underline{u}$ into baseband digital signals $\underline{z}'$ and $\underline{u}'$, respectively.

Figure 12:
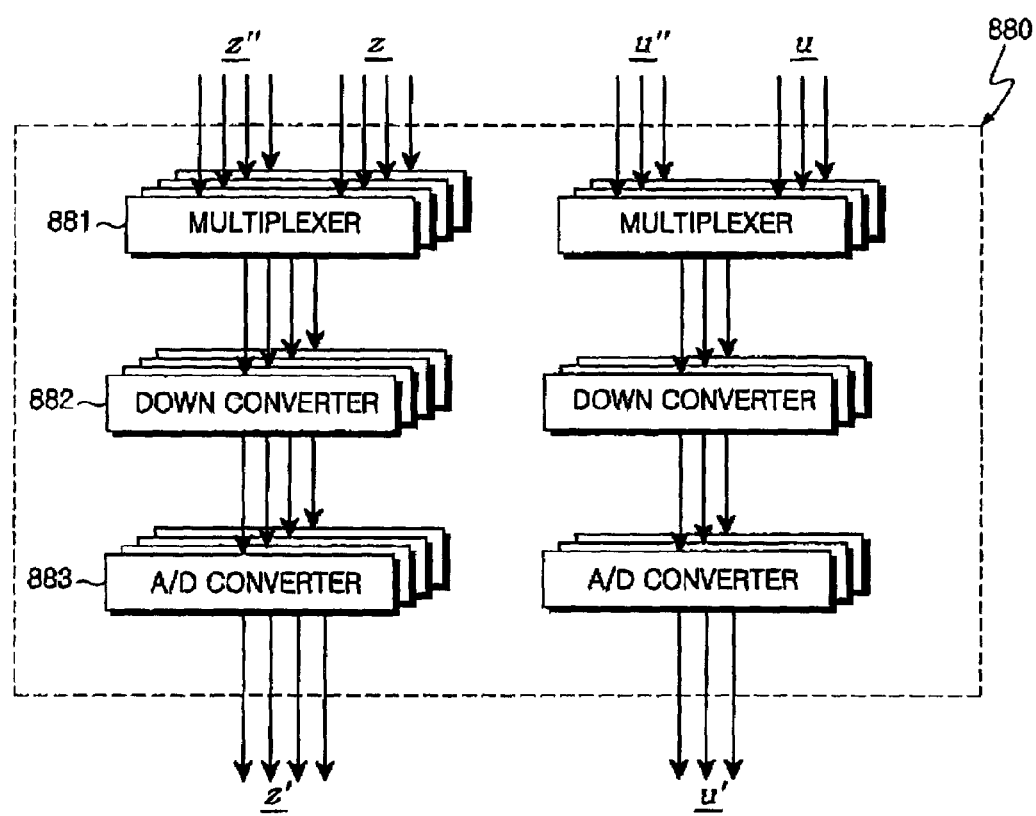
FIG. 12 is a block diagram illustrating an example of the feedback path section shown in FIG. 8 or 11 according to an embodiment of the present invention.

The feedback path section 880, as illustrated in FIG. 12, includes multiplexers 881, frequency-down converters 882 and analog-to-digital (A/D) converters 883. The feedback path section 880 collects part of the RF signals on a transmission path through the coupler 890, converts the collected RF signals into baseband signals through the frequency-down converters 882, and converts the baseband signals into digital signals through the A/C converters 883. Through the above conversion process, frequencies, signal attributes (i.e., analog signal or digital signal), and amplitude and phase of signals are changed, and in terms of adaptive signal processing, the frequencies and signal attributes are meaningless and only the amplitude and phase of signals are important. Therefore, consideration will be taken herein into only the amplitude and phase of signals.

A change in amplitude and phase between $\underline{y}$ and $\underline{y}'$ occurring through a digital-to-analog (D/A) converter and a frequency-up converter on the IF path 840 can be ascribed to a characteristic change of the power amplification section 850, thereby letting $\underline{y}=\underline{y}'$. However, for a change in amplitude and phase between $\underline{z}$ and $\underline{z}'$ and between $\underline{u}$ and $\underline{u}'$, occurring through the frequency-down converters 882 and the A/D converters 883 on the feedback path section 880, there is no means for absorbing the change, so the change component must be measured and calibrated by an appropriate means. If constant transfer characteristics of the frequency-down converters and the A/D converters are changed during operation, the calibrator 891 and the multiplexers 881 are optionally provided as illustrated in the drawings to measure and store the transfer characteristics at stated periods during system operation and then apply their calibration values to the adaptive signal processor 800. The adaptive signal processor 800 calibrates the received signals $\underline{z}'$ and $\underline{u}'$ into $\underline{z}$ and $\underline{u}$ by using the calibration values $\Delta\underline{z}$ and $\Delta\underline{u}$. To this end, the calibrator 891 estimates a transfer characteristic of the feedback path section 880 through the multiplexers 881 by generating calibration test signals $\underline{z}''$ and $\underline{u}''$, and then provides the estimation results to the adaptive signal processor 800 as the calibration values $\Delta\underline{z}$ and $\Delta\underline{u}$. Several methods can be considered in realizing the calibrator 891. First, there is a time division method for estimating a characteristic of the feedback path section 880 by converting inputs of the coupler 890 into test signals $\underline{z}''$ and $\underline{u}''$ from normal transmission signals $\underline{z}$ and $\underline{u}$ through a switching operation of the multiplexers 881 at stated periods. Second, there is a code division method for estimating a transfer characteristic of the feedback path section 880 by generating test signals having less correlation with the normal transmission signals $\underline{z}$ and $\underline{u}$ and providing the test signals to the feedback path section 880 together with the normal transmission signals through the multiplexers 881.

The adaptive signal processor 800 receives current snapshots $\underline{x}_k, \underline{z}', \underline{u}'$ and $\underline{y}'$ from the signal generator 820 and the feedback path section 880 and calibration signals $\Delta\underline{z}$ and $\Delta\underline{u}$ from the calibrator 891, and outputs a next distributor's control matrix value $A_{k+1}$.

In FIG. 11, the system controller 892 is provided to control the overall system operation, and controls the adaptive signal processor 800, the signal generator 820 and the calibrator 891.

Figure 13:
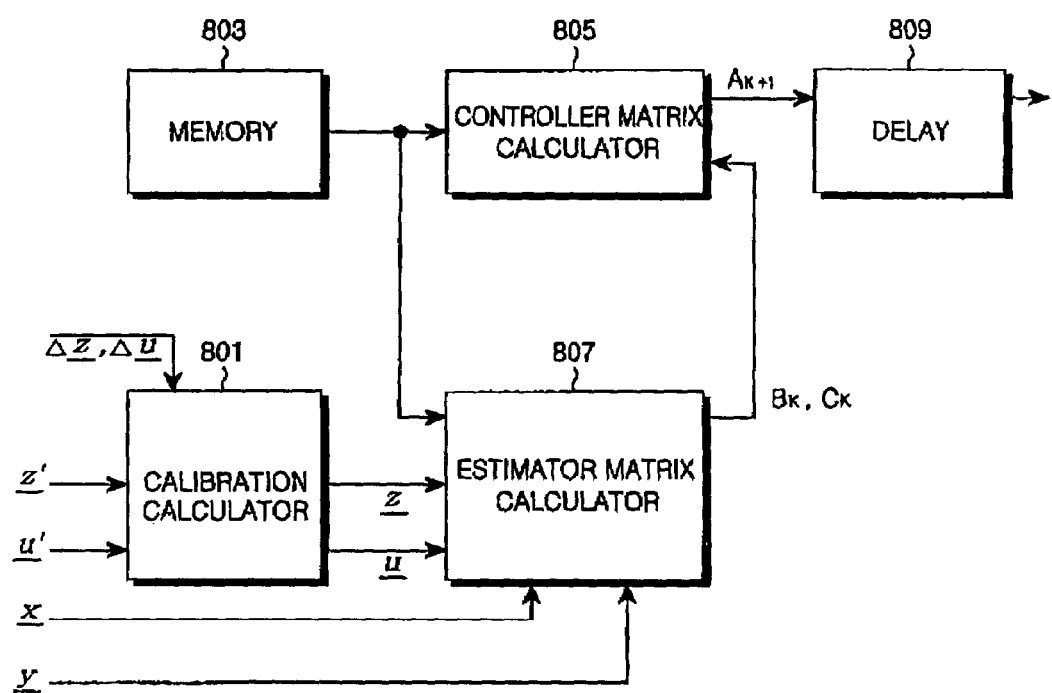
FIG. 13 is a detailed block diagram illustrating an example of the adaptive signal processor shown in FIG. 3 or 11 according to an embodiment of the present invention.

FIG. 13 is a detailed block diagram illustrating an example of the adaptive signal processor shown in FIG. 3 or 11 according to an embodiment of the present invention. The adaptive power pooling algorithm of the invention, since it operates in a digital domain, can be realized with a common digital signal process (DSP) chip and incidental coding.

The adaptive signal processor 800 comprises a calibration calculator 801, a memory 803, a control matrix calculator 805, an estimation matrix calculator 807, and a delay 809. The calibration calculator 801 receives feedback signals $\underline{z}'$ and $\underline{u}'$ from the feedback path section 880 and calibration signals $\Delta\underline{z}$ and $\Delta\underline{u}$ from the calibrator 891 of FIG. 11, and calibrates the feedback signals with the calibration signals, thereby calculating desired feedback signals $\underline{z}$ and $\underline{u}$ of the power amplification section's and combiner's output vectors. In an embodiment of the present invention, if the calibrator 891 is not separately used, calibration values estimated through simulations before operation can be pre-stored in a memory and then extracted for calibration during operation. The control matrix calculator 805 and the estimation matrix calculator 807 receive initialization values necessary for initialization of an adaptive algorithm from the memory 803, and the estimation matrix calculator 807 receives $\underline{x}$ and $\underline{y}$ from the signal generator 820 and $\underline{z}$ and $\underline{u}$ from the calibration calculator 801. The estimation matrix calculator 807 estimates a power amplification section's estimation matrix $B_k$ and a combiner's estimation matrix $C_k$ according to the power pooling algorithm illustrated in FIG. 10. The control matrix calculator 805 calculates a next distributor's control matrix $A_{k+1}$ using the estimation matrixes. The calculated $A_{k+1}$ is delayed for a predetermined time by the delay 809, and then provided to the distributor 830 as a next distributor's control matrix $A_k$.

The combiner 860 illustrated in FIGS. 8 and 11 comprises only passive elements, so it has a stable characteristic compared with active elements. Therefore, the combiner 860 can apply a characteristic measured off-line to the adaptive algorithm rather than estimating a characteristic on-line during operation.

C. Simulation Results of Proposed Adaptive Power Pooling Apparatus

FIGS. 14A to 14D illustrate output waveforms of respective sectors based on the simulation results of an adaptive power pooling apparatus according to an embodiment of the present invention. Simulation results were obtained through computer simulation under the following assumption.

From Condition (1), the number of sectors is M=3 and the number of power amplifiers including one redundant power amplifier is N=4. Here, N>M. A Gaussian random signal is generated on the assumption that an average of an input signal vector is 0 and there is no correlation between sector input signals. A combiner's characteristic matrix C is calculated by Equation (28) below on the assumption that power of input signals of respective sectors is 1, 0.25, and 0.01 Watt from the first sector, showing a considerable power difference.

In the simulation, when the adaptive algorithm does not estimate a combiner's characteristic presuming that a characteristic of the combiner is constant, a desired gain $\alpha$ of a power amplifier is set to 10. However, an actual power amplifier's gain matrix B is given by Equation (28), and a gain and a phase of a power amplifier are slightly different from their norminal values.

$$B = \begin{bmatrix} 7e^{j30°} & \cdots & \cdots & 0 \\ \vdots & 15e^{j10°} & & \vdots \\ \vdots & & 8e^{j4°} & \vdots \\ 0 & \cdots & \cdots & 9e^{-j20°} \end{bmatrix} \quad (28)$$

In addition, it is assumed that a power amplifier's output noise $\underline{v}$ is 0.01 Watt. The simulation results are illustrated in FIGS. 14A to 14D with actual waveforms of respective stages. In the simulation, a horizontal axis represents a reference time index k of an input signal.

Figure 14C:
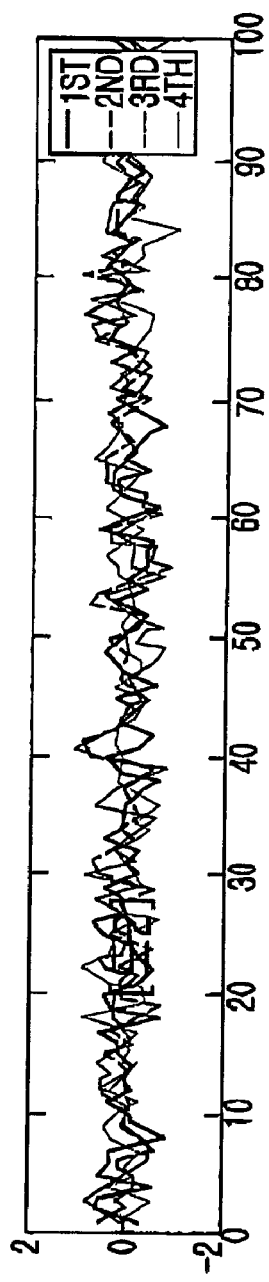
FIG. 14C is a block diagram illustrating an example of an output waveform of a power amplification section based on the simulation results of the adaptive power pooling apparatus according to an embodiment of the present invention.
Figure 14D:
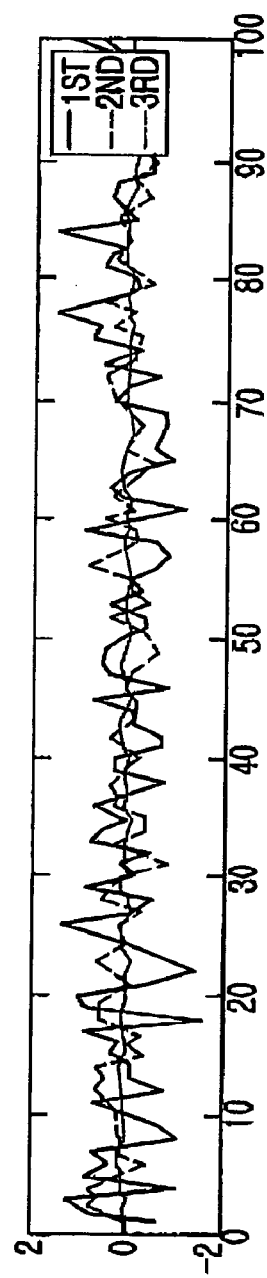
FIG. 14D is a block diagram illustrating an example of each final sector output waveform based on the simulation results of the adaptive power pooling apparatus according to an embodiment of the present invention.

FIG. 14A represents a sector input signal $\underline{x}$, FIG. 14B represents a power amplification section's input signal $\underline{y}$, FIG. 14C represents a power amplification section's output signal $\underline{z}$, and FIG. 14D represents a sector output signal $\underline{u}$.

Comparing FIGS. 14A with 14C, even though input signals are different in amplitude according to sectors, power amplification section's output signals are almost identical in power. That is, the adaptive power pooling apparatus of the invention satisfies Condition (3) of uniformly driving power amplifiers. As a result of actual calculation, power of power amplification section's output signal elements is 30.1, 29.9, 28.6 and 28.7 Watt from the first power amplifier.

Comparing FIGS. 14A with 14D, despite an actual variation in gain characteristic of a power amplifier, output signals uniformly have a desired gain of 10. That is, the adaptive power pooling apparatus of the invention satisfies Condition (2) for linear amplification of respective sectors. As a result of actual calculation, the total power of front and rear stages of a combiner is 117.45 and 117.41 Watt, which are almost same. Therefore, a signal amplified by a power amplifier is provided to an antenna via a combiner without a loss. That is, Condition (4) for a combiner without a power loss is satisfied. From the foregoing description, it is noted that the power pooling apparatus proposed by the invention satisfies all requirements for power pooling.

As described above, the invention can uniformly drive power amplifiers of respective sectors in a mobile communication system including a power pooling system with a cascade structure of distributor-power amplification section-combiner. In addition, the invention provides an apparatus and method for adaptively estimating a distributor's transfer characteristic matrix in order to uniformly drive a power pooling system for respective sectors. Moreover, the invention can increase driving efficiency of a power pooling apparatus by using a redundant power amplifier.

While the invention has been shown and described with reference to a certain embodiments thereof, it will be understood by those skilled in the art that various changes in form and details may be made therein without departing from the spirit and scope of the invention as defined by the appended claims.

What is claimed is:

1. A power pooling apparatus for uniformly distributing sector loads in a mobile communication system, comprising:
   a distributor for distributing signals output from a signal generator according to respective sectors;
   a radio signal processor for performing signal processing to provide an output of the distributor to an antenna; and
   an adaptive signal processor for determining a characteristic matrix of the distributor by using an output in a predetermined position on a signal processing path of the radio signal processor, and providing the characteristic matrix of the distributor to the distributor.

2. The power pooling apparatus of claim 1, wherein the predetermined position on a signal processing path of the radio signal is an output of a power amplifier.

3. The power pooling apparatus of claim 1, wherein the predetermined position on a signal processing path of the radio signal is an output of a combiner.

4. The power pooling apparatus of claim 1, wherein the predetermined position on a signal processing path of the radio signal is an output of the distributor.

5. The power pooling apparatus of claim 1, wherein the adaptive signal processor updates the characteristic matrix of the distributor by estimating a characteristic matrix on the signal processing path in a predetermined position of the signal processing path.

6. The power pooling apparatus of claim 5, wherein the characteristic matrix on the signal processing path is a characteristic matrix of a power amplifier existing on the signal processing path of the radio signal processor.

7. The power pooling apparatus of claim 5, wherein the characteristic matrix on the signal processing path is a characteristic matrix of a combiner existing on the signal processing path of the radio signal processor.

8. The power pooling apparatus of claim 1, wherein the radio signal processor comprises:
a power amplifier for amplifying signals output from the distributor; and
a combiner for combining the amplified signals with signals which are power-amplified in the same type as the signals output from the signal generator.

9. The power pooling apparatus of claim 8, wherein the radio signal processor further comprises a feedback path section for forming a feedback path from the combiner and the adaptive signal processor, and converting an output signal of the power amplifier and an output signal of the combiner into baseband signals.

10. The power pooling apparatus of claim 9, wherein the radio signal processor further comprises a calibrator estimating a transfer characteristic of the feedback path section and compensating output signals of the power amplifier and output signals of the combiner.

11. The power pooling apparatus of claim 9, wherein the feedback path section further comprises:
a multiplexer for multiplexing input/output signals of the combiner and a calibration test signal;
a frequency-down converter for down-converting an output signal of the multiplexer into a baseband signal; and
a converter for converting an analog signal down-converted by the frequency-down converter into a digital signal.

12. The power pooling apparatus of claim 1, wherein the adaptive signal processor comprises:
a memory for storing information necessary for initialization of an adaptive algorithm;
a calibration calculator for calibrating signals output from the radio signal processor;
an estimation matrix calculator for calculating a characteristic matrix on the signal processing path by using an initialization value received from the memory, output signals of the calibration calculator, and input signals and output signals of the distributor;
a control matrix calculator for calculating a next characteristic matrix of the distributor at a next time by receiving a value calculated by the estimation matrix calculator; and a delay for delaying an output value of the control matrix calculator for a predetermined time.

13. The power pooling apparatus of claim 12, wherein the estimation matrix calculator receives a set of an input vector of the distributor, an output vector of the distributor and an output vector of the calibration calculator and information necessary for calculating the next characteristic matrix of the distributor, and calculating a characteristic matrix on the signal processing path by using a recursive least squares method (RLS).

14. The power pooling apparatus of claim 13, wherein the recursive least squares method comprises:
calculating $b_{i,k}$ defined as $$b_{i,k} = b_{i,k-1} = (z_{i,k} - b_{i,k} y_{i,k}) y_{i,k} * \frac{1}{P_{i,k}}$$

$$P_{i,k} = \lambda P_{i,k-1} + |y_{i,k}|^2$$

estimating a characteristic matrix of an $i^{th}$ power amplifier existing on the signal processing path of the radio signal processor at a $k^{th}$ time, the characteristic matrix using the $b_{i,k}$ as an element value, wherein $\lambda$ represents a forgetting factor, P represents a compensation matrix for phase variation, y represents an input vector of the power amplifier, and z represents an input vector of the combiner.

15. The power pooling apparatus of claim 14, wherein the recursive least squares method comprises:
calculating $C_k$ defined as $$C_k = C_{k-1} + \left( u_k - C_{k-1} z_k^H \frac{Q_{k-1}}{z_k^H Q_{k-1} z_k + \lambda} \right)$$

$$Q_k = \lambda^{-1} \left( Q_{k-1} - \frac{Q_{k-1} z_k z_k^H Q_{k-1}}{z_k^H Q_{k-1} z_k + \lambda} \right); \text{ and}$$

estimating a characteristic matrix of the combiner existing on the signal processing path of the radio signal processor at a $k^{th}$ time, the characteristic matrix using the $C_k$ as an element value, wherein $\lambda$ represents a forgetting factor, Q represents a compensation matrix for a variation in output order, z represents an input vector of the combiner, and u represents an output vector of the combiner.

16. The power pooling apparatus of claim 15, wherein the recursive least squares method comprises:
calculating $A_{k+1}$ defined as $A_{k+1} = \alpha B^{-1}{}_k C^{-1}{}_k$ or $A_{k+1} = \alpha B^{-1}{}_k C^+{}_k$; and calculating a next characteristic matrix of the distributor to be used at a $(k+1)^{th}$ time following the $k^{th}$ time in accordance with the above equation by using the estimated $b_{i,k}$ and $C_k$, the characteristic matrix using the $A_{k+1}$ as an element value, wherein $\alpha$ represents a gain of the power amplifier.

17. A power pooling method for uniformly distributing sector loads in a mobile communication system, comprising the steps of:
uniformly distributing signals output from a signal generator according to respective sectors;
performing radio signal processing on the distributed signals; and determining a characteristic matrix of a distributor by using an output in a predetermined position on a radio signal processing path.

18. The power pooling method of claim 17, wherein the predetermined position on a radio signal processing path is an output of a power amplifier.

19. The power pooling method of claim 17, wherein the predetermined position on a radio signal processing path is an output of a combiner.

20. The power pooling method of claim 17, wherein the predetermined position on a radio signal processing path is an output of the distributor.

21. The power pooling method of claim 17, further comprising the step of updating the characteristic matrix of the distributor by estimating a characteristic matrix on the radio signal processing path in a predetermined position of the radio signal processing path.

22. The power pooling method of claim 21, wherein the characteristic matrix on the radio signal processing path is a characteristic matrix of a power amplifier existing on the radio signal processing path.

23. The power pooling method of claim 21, wherein the characteristic matrix on the radio signal processing path is a characteristic matrix of a combiner existing on the radio signal processing path.

24. The power pooling method of claim 17, wherein the radio signal processing step comprises the step of:
    amplifying, by a power amplifier, power of signals output from the distributor; and
    combining, by a combiner, the amplified signals with signals which are power-amplified in the same type as the signals output from the signal generator.

25. The power pooling method of claim 24, wherein the radio signal processing step further comprises the step of converting the power-amplified signal and the combined signal into baseband signals.

26. The power pooling method of claim 25, wherein the radio signal processing step further comprises the step of compensating the power-amplified signal and the combined signal.

27. The power pooling method of claim 25, wherein the step of converting the power-amplified signal and the combined signal into baseband signals comprises the steps of:
    multiplexing the power-amplified signal, the combined signal and a calibration test signal;
    down-converting the multiplexed signal into a baseband signal; and
    converting the down-converted analog signal into a digital signal.

28. The power pooling method of claim 17, wherein the step of determining a characteristic matrix of the distributor comprises the steps of:
    storing information necessary for initialization of an adaptive algorithm;
    calculating calibration signals for calibrating signals output from a radio signal processor;
    calculating a characteristic matrix on the radio signal processing path by using the stored initialization value and the calibrated signals;
    calculating a next characteristic matrix of the distributor by receiving the calculated value of the characteristic matrix on the radio signal processing path; and
    delaying the calculated value of the next characteristic matrix of the distributor for a predetermined time.

29. The power pooling method of claim 28, wherein the estimation matrix calculation step comprises the step of receiving a set of an input vector of the distributor, an output vector of the distributor and an output vector of the calibration calculator and information necessary for calculating the next characteristic matrix of the distributor, and calculating a characteristic matrix on the radio signal processing path by using a recursive least squares method (RLS).

30. The power pooling method of claim 29, wherein the recursive least squares method comprises the steps of:
    calculating $b_{i,k}$ defined as $$b_{i,k} = b_{i,k-1} = (z_{i,k} - b_{i,k}y_{i,k})y_{i,k} * \frac{1}{P_{i,k}}$$

$$P_{i,k} = \lambda P_{i,k-1} + |y_{i,k}|^2$$

estimating a characteristic matrix of an $i^{th}$ power amplifier existing on the radio signal processing path of the radio signal processor at a $k^{th}$ time, the characteristic matrix using the $b_{i,k}$ as an element value, wherein $\lambda$ represents a forgetting factor, P represents a compensation matrix for phase variation, y represents an input vector of the power amplifier, and z represents an input vector of the combiner.

31. The power pooling method of claim 30, wherein the recursive least squares method comprises the steps of:
    calculating $C_k$ defined as $$C_k = C_{k-1} + \left(u_k - C_{k-1}z_k^H \frac{Q_{k-1}}{z_k^H Q_{k-1} z_k + \lambda}\right)$$

$$Q_k = \lambda^{-1}\left(Q_{k-1} - \frac{Q_{k-1}z_k z_k^H Q_{k-1}}{z_k^H Q_{k-1} z_k + \lambda}\right); \text{ and}$$

estimating a characteristic matrix of the combiner existing on the radio signal processing path of the radio signal processor at a $k^{th}$ time, the characteristic matrix using the $C_k$ as an element value, wherein $\lambda$ represents a forgetting factor, Q represents a compensation matrix for a variation in output order, z represents an input vector of the combiner, and u represents an output vector of the combiner.

32. The power pooling method of claim 31, wherein the recursive least squares method comprises the steps of:
    calculating $A_{k+1}$ defined as $A_{k+1} = \alpha B^{-1}{}_k C^{-1}{}_k$ or $A_{k+1} = \alpha B^{-1}{}_k C^{+}{}_k$; and calculating a next characteristic matrix of the distributor to be used at a $(k+1)^{th}$ time following the $k^{th}$ time in accordance with the above equation by using the estimated $b_{i,k}$ and $C_k$, the characteristic matrix using the $A_{k+1}$ as an element value, wherein a represents a gain of the power amplifier.

* * * * *